United States Patent
Hrehor, Jr. et al.

(10) Patent No.: US 11,067,269 B1
(45) Date of Patent: Jul. 20, 2021

(54) SYSTEM AND METHOD FOR BACKLIGHT INTEGRATION WITH ELECTRICAL CONTACT FOIL IN PIEZOELECTRIC HAPTIC KEYBOARD

(71) Applicant: Dell Products, LP, Round Rock, TX (US)

(72) Inventors: Robert D. Hrehor, Jr., Round Rock, TX (US); Priyank Gajiwala, Austin, TX (US); Michiel Knoppert, Amsterdam (NL)

(73) Assignee: Dell Products, LP, Round Rock, TX (US)

( * ) Notice: Subject to any disclaimer, the term of this patent is extended or adjusted under 35 U.S.C. 154(b) by 0 days.

(21) Appl. No.: 16/777,911

(22) Filed: Jan. 31, 2020

(51) Int. Cl.
*G06F 3/02* (2006.01)
*G09G 5/00* (2006.01)
(Continued)

(52) U.S. Cl.
CPC ............ *F21V 33/0052* (2013.01); *F21V 3/02* (2013.01); *F21V 23/005* (2013.01);
(Continued)

(58) Field of Classification Search
CPC ........... G06F 3/016; G06F 3/017; G06F 3/044
See application file for complete search history.

(56) References Cited

U.S. PATENT DOCUMENTS 4,618,797 A    10/1986   Cline
4,857,887 A     8/1989   Iten
(Continued)

FOREIGN PATENT DOCUMENTS

JP    2014164610 A    9/2014
KR    100442116 B1    7/2004
(Continued)

OTHER PUBLICATIONS

Rekimoto, J., et al., "PreSensell: Bi-directional Touch and Pressure Sensing Interactions with Tactile Feedback," Apr. 2006, 6 pages.
(Continued)

*Primary Examiner* — Nan-Ying Yang
(74) *Attorney, Agent, or Firm* — Prol Intellectual Property Law, PLLC; H. Kenneth Prol

(57) ABSTRACT

A backlit haptic keyboard of an information handling system may comprise a contact foil placed between a coversheet and a support layer, operatively coupling an LED controller to an LED via metallic traces printed upon a top surface of the contact foil and operatively coupling a piezoelectric element to a keyboard controller via metallic traces printed upon a bottom surface of the contact foil. The system may further comprise the LED placed between the coversheet and the contact foil, and a piezoelectric element placed between the contact foil and support layer to receive an applied mechanical stress at a key and generate an electric actuation signal. A keyboard controller of the information handling system may receive an electric actuation signal from the piezoelectric element via the bottom metallic traces and send an electrical haptic response control signal to the piezoelectric element to cause it to generate haptic feedback at the key.

20 Claims, 7 Drawing Sheets

(51) Int. Cl.

| | |
|---|---|
| *F21V 33/00* | (2006.01) |
| *F21V 23/00* | (2015.01) |
| *H01L 41/113* | (2006.01) |
| *F21V 3/02* | (2006.01) |
| *H05K 3/34* | (2006.01) |
| *H01L 41/25* | (2013.01) |
| *H05K 1/03* | (2006.01) |
| *H05B 45/10* | (2020.01) |
| *H05B 45/20* | (2020.01) |
| *H01L 41/047* | (2006.01) |
| *H05K 1/09* | (2006.01) |
| *G06F 1/16* | (2006.01) |
| *G06F 3/01* | (2006.01) |
| *H05K 1/02* | (2006.01) |
| *F21W 131/30* | (2006.01) |
| *F21Y 115/10* | (2016.01) |

(52) U.S. Cl.
CPC ............ *G06F 1/1662* (2013.01); *G06F 3/016* (2013.01); *G06F 3/0202* (2013.01); *H01L 41/0475* (2013.01); *H01L 41/1132* (2013.01); *H01L 41/25* (2013.01); *H05B 45/10* (2020.01); *H05B 45/20* (2020.01); *H05K 1/0277* (2013.01); *H05K 1/0393* (2013.01); *H05K 1/09* (2013.01); *H05K 3/341* (2013.01); *F21W 2131/30* (2013.01); *F21Y 2115/10* (2016.08); *H05K 2201/0145* (2013.01); *H05K 2201/10083* (2013.01); *H05K 2201/10106* (2013.01)

(56) References Cited

U.S. PATENT DOCUMENTS

| | | | |
|---|---|---|---|
| 5,463,388 | A | 10/1995 | Boie |
| 5,825,352 | A | 10/1998 | Bisset |
| 5,861,583 | A | 1/1999 | Schediwy |
| 5,887,995 | A | 3/1999 | Holehan |
| 6,147,680 | A | 11/2000 | Tareev |
| 6,188,391 | B1 | 2/2001 | Seely |
| 6,239,790 | B1 | 5/2001 | Martinelli |
| 6,532,824 | B1 | 3/2003 | Ueno |
| 6,574,095 | B2 | 6/2003 | Suzuki |
| 6,680,731 | B2 | 1/2004 | Gerpheide |
| 6,703,550 | B2 | 3/2004 | Chu |
| 6,822,635 | B2 | 11/2004 | Shahoian |
| 6,882,337 | B2 | 4/2005 | Shetter |
| 7,336,260 | B2 | 2/2008 | Martin |
| 7,439,962 | B2 | 10/2008 | Reynolds |
| 7,486,279 | B2 | 2/2009 | Wong |
| 7,523,410 | B2 | 4/2009 | Rekimoto |
| 7,535,454 | B2 | 5/2009 | Jasso |
| 7,741,979 | B2 | 6/2010 | Schlosser |
| 7,808,488 | B2 | 10/2010 | Martin |
| 8,144,453 | B2 | 3/2012 | Brown |
| 8,159,461 | B2 | 4/2012 | Martin |
| 8,164,573 | B2 | 4/2012 | DaCosta |
| 8,199,033 | B2 | 6/2012 | Peterson |
| 8,248,277 | B2 | 8/2012 | Peterson |
| 8,248,278 | B2 | 8/2012 | Schlosser |
| 8,279,052 | B2 | 10/2012 | Heubel |
| 8,294,600 | B2 | 10/2012 | Peterson |
| 8,294,677 | B2 | 10/2012 | Wu |
| 8,373,664 | B2 | 2/2013 | Wright |
| 8,477,113 | B2 | 7/2013 | Wu |
| 8,508,487 | B2 | 8/2013 | Schwesig |
| 8,542,134 | B2 | 9/2013 | Peterson |
| 8,581,710 | B2 | 11/2013 | Heubel |
| 8,633,916 | B2 | 1/2014 | Bernstein |
| 8,674,941 | B2 | 3/2014 | Casparian |
| 8,749,507 | B2 | 6/2014 | DaCosta |
| 8,773,356 | B2 | 7/2014 | Martin |
| 8,797,295 | B2 | 8/2014 | Bernstein |
| 8,842,091 | B2 | 9/2014 | Simmons |
| 9,178,509 | B2 | 11/2015 | Bernstein |
| 9,274,660 | B2 | 3/2016 | Bernstein |
| 9,280,248 | B2 | 3/2016 | Bernstein |
| 9,318,006 | B2 | 4/2016 | Heubel |
| 9,336,969 | B2 | 5/2016 | Takashima |
| 9,400,582 | B2 | 7/2016 | Bernstein |
| 9,477,342 | B2 | 10/2016 | Daverman |
| 9,535,557 | B2 | 1/2017 | Bernstein |
| 9,829,982 | B2 | 11/2017 | Bernstein |
| 10,089,840 | B2 | 10/2018 | Moussette |
| 10,120,450 | B2 | 11/2018 | Bernstein |
| 10,860,112 | B1 | 12/2020 | Knoppert |
| 2006/0109255 | A1 | 5/2006 | Chen |
| 2006/0180450 | A1* | 8/2006 | Clark ........................ B08B 3/04 200/333 |
| 2007/0063987 | A1 | 3/2007 | Sato |
| 2007/0273671 | A1 | 11/2007 | Zadesky |
| 2008/0098456 | A1 | 4/2008 | Alward |
| 2008/0202824 | A1 | 8/2008 | Philipp |
| 2008/0259046 | A1 | 10/2008 | Carsanaro |
| 2009/0001387 | A1* | 1/2009 | Kimura ............... H01L 27/1266 257/79 |
| 2009/0002178 | A1 | 1/2009 | Guday |
| 2009/0243817 | A1 | 10/2009 | Son |
| 2009/0315854 | A1 | 12/2009 | Matsuo |
| 2010/0089735 | A1 | 4/2010 | Takeda |
| 2010/0102830 | A1 | 4/2010 | Curtis |
| 2010/0110018 | A1 | 5/2010 | Faubert |
| 2010/0128002 | A1 | 5/2010 | Stacy |
| 2012/0062491 | A1 | 3/2012 | Coni |
| 2012/0092263 | A1 | 4/2012 | Peterson |
| 2013/0249802 | A1 | 9/2013 | Yasutake |
| 2014/0218303 | A1* | 8/2014 | Kao ....................... G06F 3/0219 345/168 |
| 2015/0185842 | A1 | 7/2015 | Picciotto |
| 2016/0093452 | A1* | 3/2016 | Zercoe .................. H01H 13/83 200/314 |
| 2017/0269688 | A1 | 9/2017 | Chan |
| 2018/0074694 | A1 | 3/2018 | Lehmann |
| 2019/0073036 | A1 | 3/2019 | Bernstein |
| 2019/0212831 | A1* | 7/2019 | Goldberg ............... H01H 11/00 |

FOREIGN PATENT DOCUMENTS

| | | |
|---|---|---|
| KR | 20040081697 A | 9/2004 |
| WO | 2004/042685 A2 | 5/2004 |
| WO | 2004/042693 A1 | 5/2004 |
| WO | 2005/057546 A1 | 6/2005 |
| WO | 2011/056752 A1 | 5/2011 |
| WO | 2011/071837 A2 | 6/2011 |

OTHER PUBLICATIONS

Rekimoto, J. et al., "PreSense: Interaction Techniques for Finger Sensing Input Devices," UIST '03 Vancouver, BC, Canada, Nov. 2003, pp. 203-212, ACM 1-58113-636-06/03/0010.

Holleis, P. et al., "Studying Applications for Touch-Enabled Mobile Phone Keypads," Proceedings of the Second International Conference on Tangible and Embedded Interaction (TEI'08), Feb. 18-20, 2008, Bonn, Germany, pp. 15-18.

Westerman, W. et al., "Multi-Touch: A New Tactile 2-D Gesture Interface for Human-Computer Interaction," Proceedings of the Human Factors and Ergonomics Society 45th Annual Meeting, Oct. 2001, pp. 632-636.

* cited by examiner

US 11,067,269 B1

SYSTEM AND METHOD FOR BACKLIGHT INTEGRATION WITH ELECTRICAL CONTACT FOIL IN PIEZOELECTRIC HAPTIC KEYBOARD

FIELD OF THE DISCLOSURE

The present disclosure generally relates to a key switch assembly of, for example, an information handling system. The present disclosure more specifically relates to the use of light emitting diode (LED) backlighting in a keyboard of an information handling system having piezoelectric sensor and haptic generator elements.

BACKGROUND

As the value and use of information continues to increase, individuals and businesses seek additional ways to process and store information. One option available to clients is information handling systems. An information handling system generally processes, compiles, stores, and/or communicates information or data for business, personal, or other purposes thereby allowing clients to take advantage of the value of the information. Because technology and information handling may vary between different clients or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific client or specific use, such as e-commerce, financial transaction processing, airline reservations, enterprise data storage, or global communications. In addition, information handling systems may include a variety of hardware and software components that may be configured to process, store, and communicate information and may include one or more computer systems, data storage systems, and networking systems. The information handling system may include telecommunication, network communication, and video communication capabilities. Further, the information handling system may include a keyboard or other input or output devices such as cursor control devices for manual input of information by the user.

BRIEF DESCRIPTION OF THE DRAWINGS

It will be appreciated that for simplicity and clarity of illustration, elements illustrated in the Figures are not necessarily drawn to scale. For example, the dimensions of some elements may be exaggerated relative to other elements. Embodiments incorporating teachings of the present disclosure are shown and described with respect to the drawings herein, in which.

The use of the same reference symbols in different drawings may indicate similar or identical items.

DETAILED DESCRIPTION OF THE DRAWINGS

Figure 1:
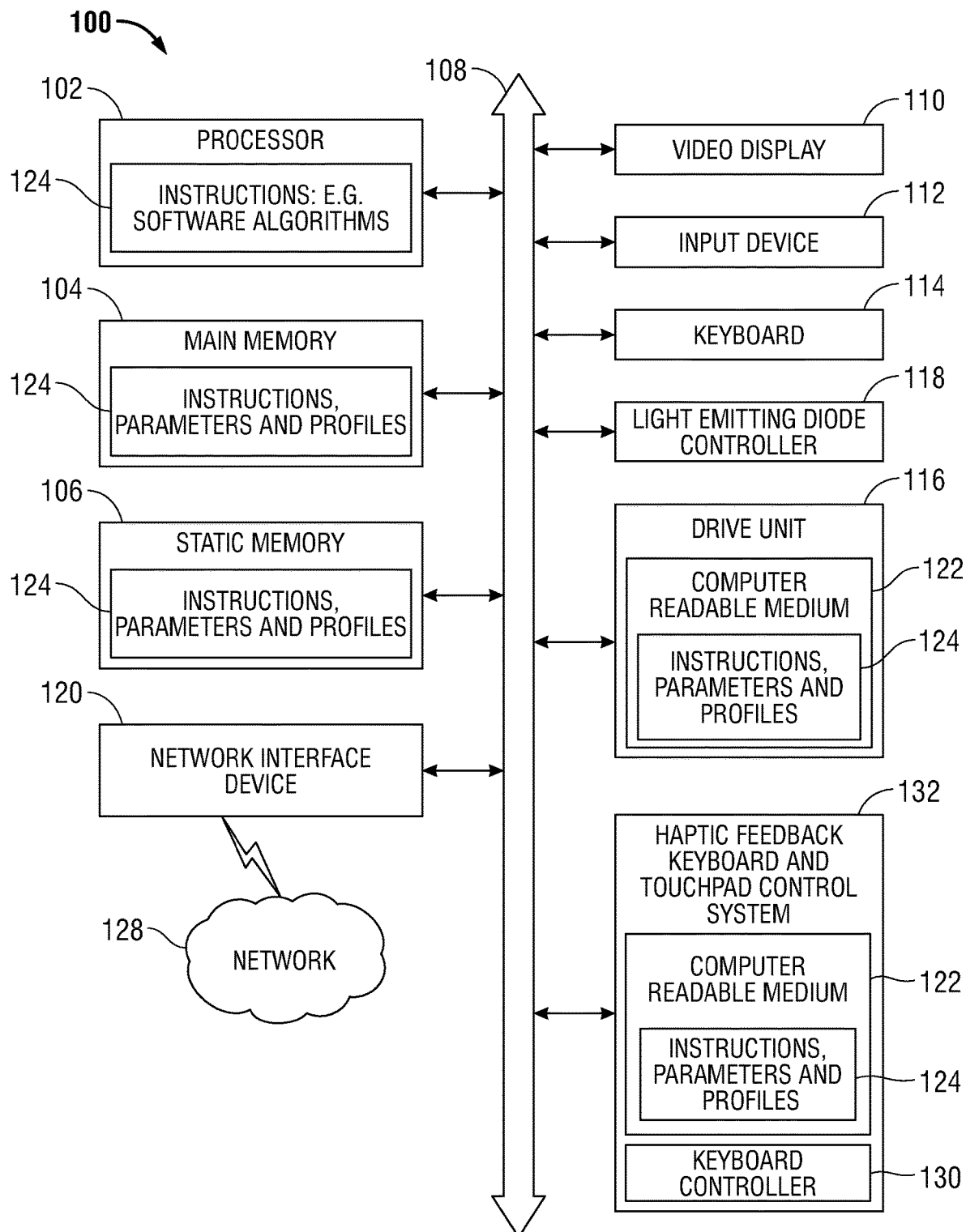
FIG. 1 is a block diagram illustrating an information handling system according to an embodiment of the present disclosure.

The following description in combination with the Figures is provided to assist in understanding the teachings disclosed herein. The description is focused on specific implementations and embodiments of the teachings, and is provided to assist in describing the teachings. This focus should not be interpreted as a limitation on the scope or applicability of the teachings.

User demand drives the market for mobile information handling systems toward ever-slimmer, more lightweight laptop devices, prompting a need for ever-thinner keyboards and laptop bases. A solid-state piezoelectric keyboard provides a thinner, more light-weight improvement over traditional scissor mechanism keyboards. The use of piezoelectric elements within the keyboard may eliminate the use of other devices such as a scissor mechanism that are used to maintain a keycap of a key above an electrical connection or for a dive board type mechanism under a touchpad. Instead, such piezoelectric elements may reduce or eliminate those mechanical elements that may fail after a number of actuations while also reducing the thickness of the keyboard or the touchpad itself. Instead of the keys of the keyboard requiring travel of a scissor mechanism within a C-cover of the information handling system, the relatively thinner keys defined (either physically or visibly) on the solid-state keyboard of the presently-described information handling system may reduce the physical thickness of the keyboard within the information handling system. Further, the solid-state touchpad may eliminate the dive board mechanism and underlying click switch for selection of items via the mechanically actuated touchpad. This may enable a thinner, more streamlined information handling system.

Embodiments of the present disclosure provide for a keyboard of an information handling system. The keyboard may include, in an embodiment, a coversheet to identify an actuation location of an input actuation device. In an embodiment a support layer may be placed underneath the coversheet to support the coversheet and other layers within the keyboard. The keyboard may, in an embodiment, include a contact foil placed between the coversheet and support layer. In the embodiments presented herein, the keyboard may include a piezoelectric element placed between the contact foil and support layer to receive an applied mechanical stress at the actuation location of the input actuation device. The keyboard of the information handling system, in an embodiment, may include a controller of the information handling system operatively coupled to the contact foil to receive an electric charge from the piezoelectric element placed under the mechanical stress. The controller may also send an electrical haptic response control signal to the piezoelectric element of a signal varying in polarity, voltage or current to cause the piezoelectric element to provide haptic feedback at the actuation location.

During operation of the solid-state keyboard or touchpad of the information handling system described in embodiments herein, a key on the keyboard or the touchpad may be actuated by a user pressing down on a specific location. In an embodiment, this specific location may be visually indicated by an alphanumeric symbol such as those found on a QWERTY keyboard, a key pedestal or raised location, or another designation such as a tactile frame or depression in a cover sheet. The actuations of these specific locations by, for example, a user's finger causes a mechanical stress to be applied to the piezoelectric element resulting in the deformation of the piezoelectric element. Upon application of this mechanical stress and the deformation of the piezoelectric element, the piezoelectric element accumulates an electric charge that is passed to a controller of the information handling system via the contact foil described herein. In an embodiment, the controller receives the electrical charge and sends an electrical haptic response control signal back to the piezoelectric element. Upon application of the electrical haptic response control signal on the piezoelectric element by the controller, the piezoelectric element may be mechanically stretched or compressed so as to create a haptic feedback event such as the piezoelectric element warping up or down and returning to its pre-deformed state. This warping of the layers of the piezoelectric element causes the user to feel a haptic sensation at the actuated key or the specific location where the user pressed in order to actuate a key or touchpad. This haptic feedback against the user's finger causes a sensation mimicking pressing a mechanical key thereby creating a feeling to a user that the key was pressed or that a touchpad has been clicked to select an item such as one displayed on a display screen in some embodiments. In other embodiments, a variety of electrical haptic response control signals and corresponding haptic feedback events are contemplated however. For example, variations of haptic movement, vibrations, pulsing, clicks, or sounds may be used in various embodiments and generated at the piezoelectric elements associated with a key for a haptic event in variations of several embodiments herein.

In order to further decrease the thickness and weight of the keyboard and laptop base, one or more layers of the keyboard in embodiments of the present disclosure may provide a dual purpose as part of the piezoelectric system described above. For example, a contact foil layer may be used as part of a backlighting system emitting light through translucent portions of the keyboard coversheet as well as providing electrical coupling for the piezoelectric elements for haptic feedback events. Traditional backlighting keyboard systems include a light emitting diode (LED) receiving voltage through a printed circuit board operably connected to an LED controller. Additionally, such traditional systems may also include a light guide layer disposed between the LED and the keyboard coversheet or scissor key caps. Such a layer is in addition to the thickness of the mechanical actuation system for the keys, including the scissor key caps and actuation switches located thereunder and any rubber domes or other structures that may be used.

Instead of incorporating these additional printed circuit board and light guide layers to a mechanical actuation setup, the piezoelectric keyboard of embodiments of the present disclosure use one or more of the existing layers of the piezoelectric keyboard described herein to provide electric coupling functionality to both piezoelectric elements and LED backlighting. For example, the contact foil of the piezoelectric keyboard in an embodiment may have a top surface including several metal traces operably connecting a plurality of LEDs of the backlight system to the LED controller. The same contact foil layer in embodiments of the present disclosure may also have a bottom surface including several metal traces operably connecting the piezoelectric elements to the keyboard controller. In such a way, a single contact foil layer may operably connect the LEDs to the LED controller and operably connect the piezoelectric elements to the keyboard controller. In some embodiments, the contact foil layer and LEDs may be operatively coupled to a light guide layer under the coversheet layer and electrically coupled to the top traces of the contact foil layer. The solid-state coversheet of the keyboard in other embodiments of the present disclosure may also have an etched bottom surface functioning as a light guide layer, obviating the need for a separate, bulkier light guide layer. These dual-purpose uses of the contact foil and coversheet layers in embodiments of the present disclosure may thus decrease the overall thickness of the combined keyboard and backlight systems.

The overall thickness of the information handling system may be reduced so as to decrease the size and weight of the information handling system. In other embodiments, because the keyboard described herein has a reduced thickness, the space within the information handling system used to house other components, such as a battery, of the information handling system may be increased allowing for the increase in size of these components or the inclusion of additional components within the chassis of the information handling system. Additionally, because the solid-state keyboard described herein does not include the mechanical components (i.e., scissor mechanism and coupled key cap or dive board mechanism) as other keyboards or touchpads, the keyboard may be less susceptible to wear or mechanical strain over time. Instead, with the implementation of the piezoelectric elements and dual-purpose of one or more layers, the solid-state keyboard and backlight systems of embodiments herein use fewer mechanical parts and may be more robust, resulting in longer usable life.

Turning now to the figures, FIG. 1 illustrates an information handling system 100 similar to information handling systems according to several aspects of the present disclosure. In the embodiments described herein, an information handling system includes any instrumentality or aggregate of instrumentalities operable to compute, classify, process, transmit, receive, retrieve, originate, switch, store, display, manifest, detect, record, reproduce, handle, or use any form of information, intelligence, or data for business, scientific, control, entertainment, or other purposes. For example, an information handling system 100 may be a personal computer, mobile device (e.g., personal digital assistant (PDA) or smart phone), server (e.g., blade server or rack server), a consumer electronic device, a network server or storage device, a network router, switch, or bridge, wireless router, or other network communication device, a network connected device (cellular telephone, tablet device, etc.), IoT computing device, wearable computing device, a set-top box (STB), a mobile information handling system, a palmtop computer, a laptop computer, a desktop computer, a communications device, an access point (AP), a base station transceiver, a wireless telephone, a control system, a camera, a scanner, a printer, a pager, a personal trusted device, a web appliance, or any other suitable machine capable of executing a set of instructions (sequential or otherwise) that specify actions to be taken by that machine, and may vary in size, shape, performance, price, and functionality.

In a networked deployment, the information handling system 100 may operate in the capacity of a server or as a client computer in a server-client network environment, or as a peer computer system in a peer-to-peer (or distributed) network environment. In a particular embodiment, the information handling system 100 may be implemented using electronic devices that provide voice, video or data communication. For example, an information handling system 100 may be any mobile or other computing device capable of executing a set of instructions (sequential or otherwise) that specify actions to be taken by that machine. Further, while a single information handling system 100 is illustrated, the term "system" shall also be taken to include any collection of systems or sub-systems that individually or jointly execute a set, or multiple sets, of instructions to perform one or more computer functions.

The information handling system may include memory (volatile (e.g. random-access memory, etc.), nonvolatile (read-only memory, flash memory etc.) or any combination thereof), one or more processing resources, such as a central processing unit (CPU), a graphics processing unit (GPU), hardware or software control logic, or any combination thereof. Additional components of the information handling system 100 may include one or more storage devices, one or more communications ports for communicating with external devices, as well as, various input and output (I/O) devices 112, such as a keyboard 114, a touchpad, a mouse, a video/graphic display 110, or any combination thereof. The information handling system 100 may also include one or more buses operable to transmit communications between the various hardware components. Portions of an information handling system 100 may themselves be considered information handling systems 100.

A light emitting diode controller 118 may also be included, in an embodiment, within the information handling system 100. In an embodiment, the light emitting diode controller 118 may be operably coupled to a plurality of light emitting diodes providing backlighting for the keyboard 114. The light emitting diode controller 118 in an embodiment may control intensity, color, or other aspects of visible light emitting from each of such a plurality of diodes.

Information handling system 100 may include devices or modules that embody one or more of the devices or execute instructions for the one or more systems and modules described herein, and operates to perform one or more of the methods described herein. The information handling system 100 may execute code instructions 124 that may operate on servers or systems, remote data centers, or on-box in individual client information handling systems according to various embodiments herein. In some embodiments, it is understood any or all portions of code instructions 124 may operate on a plurality of information handling systems 100.

The information handling system 100 may include a processor 102 such as a central processing unit (CPU), control logic or some combination of the same. Any of the processing resources may operate to execute code that is either firmware or software code. Moreover, the information handling system 100 may include memory such as main memory 104, static memory 106, or other memory of computer readable medium 122 storing instructions 124 of the haptic feedback keyboard and touchpad control system 132, and drive unit 116 (volatile (e.g. random-access memory, etc.), nonvolatile memory (read-only memory, flash memory etc.) or any combination thereof. The information handling system 100 may also include one or more buses 108 operable to transmit communications between the various hardware components such as any combination of various input and output (I/O) devices.

The information handling system 100 may further include a video display 110. The video display 110 in an embodiment may function as a liquid crystal display (LCD), an organic light emitting diode (OLED), a flat panel display, or a solid-state display. Additionally, the information handling system 100 may include an input device 112, such as a cursor control device (e.g., mouse, touchpad, or gesture or touch screen input), and a keyboard 114. Various drivers and control electronics may be operatively coupled to operate input devices 112 such as the haptic keyboard 110 and haptic touchpad according to the embodiments described herein.

The network interface device shown as wireless adapter 120 may provide connectivity to a network 128, e.g., a wide area network (WAN), a local area network (LAN), wireless local area network (WLAN), a wireless personal area network (WPAN), a wireless wide area network (WWAN), or other network. Connectivity may be via wired or wireless connection. The wireless adapter 120 may operate in accordance with any wireless data communication standards. To communicate with a wireless local area network, standards including IEEE 802.11 WLAN standards, IEEE 802.15 WPAN standards, WWAN such as 3GPP or 3GPP2, or similar wireless standards may be used. In some aspects of the present disclosure, one wireless adapter 120 may operate two or more wireless links.

Wireless adapter 120 may connect to any combination of macro-cellular wireless connections including 2G, 2.5G, 3G, 4G, 5G or the like from one or more service providers. Utilization of radiofrequency communication bands according to several example embodiments of the present disclosure may include bands used with the WLAN standards and WWAN carriers, which may operate in both licensed and unlicensed spectrums.

In some embodiments, software, firmware, dedicated hardware implementations such as application specific integrated circuits, programmable logic arrays and other hardware devices may be constructed to implement one or more of some systems and methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

In accordance with various embodiments of the present disclosure, the methods described herein may be implemented by firmware or software programs executable by a controller or a processor system. Further, in an exemplary, non-limited embodiment, implementations may include distributed processing, component/object distributed processing, and parallel processing. Alternatively, virtual computer system processing may be constructed to implement one or more of the methods or functionalities as described herein.

The present disclosure contemplates a computer-readable medium that includes instructions, parameters, and profiles 124 or receives and executes instructions, parameters, and profiles 124 responsive to a propagated signal, so that a device connected to a network 128 may communicate voice, video or data over the network 128. Further, the instructions 124 may be transmitted or received over the network 128 via the network interface device or wireless adapter 120.

The information handling system 100 may include a set of instructions 124 that may be executed to cause the computer system to perform any one or more of the methods or computer-based functions disclosed herein. For example, instructions 124 may execute a haptic feedback keyboard and touchpad control system 132, software agents, or other aspects or components. Various software modules comprising application instructions 124 may be coordinated by an operating system (OS), and/or via an application programming interface (API). An example operating system may include Windows®, Android®, and other OS types. Example APIs may include Win 32, Core Java API, or Android APIs.

The disk drive unit 116 and the haptic feedback keyboard and touchpad control system 132 may include a computer-readable medium 122 in which one or more sets of instructions 124 such as software may be embedded. Similarly, main memory 104 and static memory 106 may also contain a computer-readable medium for storage of one or more sets of instructions, parameters, or profiles 124 including haptic feedback modulation instructions that allow for a user to input a desired level of haptic feedback at a key or location on a touchpad. The disk drive unit 116 and static memory 106 may also contain space for data storage. Further, the instructions 124 may embody one or more of the methods or logic as described herein. For example, instructions relating to the haptic feedback keyboard and touchpad control system 132 software algorithms, processes, and/or methods may be stored here. In a particular embodiment, the instructions, parameters, and profiles 124 may reside completely, or at least partially, within the main memory 104, the static memory 106, and/or within the disk drive 116 during execution by the processor 102 of information handling system 100.

Main memory 104 may contain computer-readable medium, such as RAM in an example embodiment. An example of main memory 104 includes random access memory (RAM) such as static RAM (SRAM), dynamic RAM (DRAM), non-volatile RAM (NV-RAM), or the like, read only memory (ROM), another type of memory, or a combination thereof. Static memory 106 may contain computer-readable medium (not shown), such as NOR or NAND flash memory in some example embodiments. The haptic feedback keyboard and touchpad control system 132 may be stored in static memory 106, or the drive unit 116 on a computer-readable medium 122 such as a flash memory or magnetic disk in an example embodiment. While the computer-readable medium is shown to be a single medium, the term "computer-readable medium" includes a single medium or multiple media, such as a centralized or distributed database, and/or associated caches and servers that store one or more sets of instructions. The term "computer-readable medium" shall also include any medium that is capable of storing, encoding, or carrying a set of instructions for execution by a processor or that cause a computer system to perform any one or more of the methods or operations disclosed herein.

In a particular non-limiting, exemplary embodiment, the computer-readable medium may include a solid-state memory such as a memory card or other package that houses one or more non-volatile read-only memories. Further, the computer-readable medium may be a random-access memory or other volatile re-writable memory. Additionally, the computer-readable medium may include a magneto-optical or optical medium, such as a disk or tapes or other storage device to store information received via carrier wave signals such as a signal communicated over a transmission medium. Furthermore, a computer readable medium may store information received from distributed network resources such as from a cloud-based environment. A digital file attachment to an e-mail or other self-contained information archive or set of archives may be considered a distribution medium that is equivalent to a tangible storage medium. Accordingly, the disclosure is considered to include any one or more of a computer-readable medium or a distribution medium and other equivalents and successor media, in which data or instructions may be stored.

The information handling system 100 may also include the haptic feedback keyboard and touchpad control system 132 that may be operably connected to the bus 108 and may also be connected to the metallic traces and piezoelectric elements of a haptic keyboard 114. The haptic feedback keyboard and touchpad control system 132 computer readable medium 122 may also contain space for data storage. The haptic feedback keyboard and touchpad control system 132 may, according to the present description, perform tasks related to receiving an electric charge from a piezoelectric element and return an electrical haptic response control signal to that piezoelectric element causing a haptic feedback at a key of the keyboard 114 associated with that piezoelectric element. In these embodiments, the haptic feedback keyboard and touchpad control system 132 may receive an electric charge from any of a plurality of piezoelectric elements each associated with a key on keyboard 114 (i.e., a QWERTY keyboard), a key pad, or a location on a touchpad. Input may be received by the haptic feedback keyboard and touchpad control system 132 either simultaneously or concurrently so as to provide a return electrical haptic response control signal to the corresponding piezoelectric elements as described herein.

In an embodiment of the present description, each of the keys of keyboard 114 may be associated with a piezoelectric element. The piezoelectric element may be used to, as described herein, create an electrical charge relative to a key on the keyboard 114 and send that electrical charge to a controller. In an embodiment, the controller may receive the electrical signal indicating actuation and send an electrical haptic response control signal to the piezoelectric element. The controller of the haptic keyboard 114 may operate some or all of the haptic feedback keyboard and touchpad control system 132. Upon application of the electrical haptic response control signal at the piezoelectric element (i.e., having specific current and voltage magnitude and polarity variations) associated with the actuated key of keyboard 114 causes the piezoelectric element to convert that electrical haptic response control signal into a mechanical movement by, for example, warping the piezoelectric element upward or downward. The mechanical upward or downward movement or movements of the piezoelectric element due to the application of the electrical haptic response control signal to the piezoelectric element may be felt by a user who actuated the key of keyboard 114. The electrical haptic response control signal may comprise a sine wave, square wave, pulsed signal, burst signal, or customized changes in magnitude and polarity of varying levels of sharpness of changes, frequencies, duration or the like in a variety of embodiments. In an example embodiment, a deflection downward upon receiving an actuation charge at the piezoelectric element followed by a rebound upward and return to a resting state or level may be used to mimic actuation of a mechanical key in some example embodiments.

In an embodiment, the keyboard controller 130 may execute instructions, parameter, and profiles 124 to enact the functions of the keyboard 114 as described herein. The haptic feedback keyboard and touchpad control system 132 in an embodiment may include one or more sets of instructions that, when executed by a keyboard controller 130, processor 102 or some combination of both, and causes an electrical haptic response control signal to be applied to a piezoelectric element upon detection of an electrical charge from the piezoelectric element. The one or more sets of instructions of the haptic feedback keyboard and touchpad control system 132 may also include one or more sets of instructions that, when executed by the keyboard controller 130, determines which of any plurality of keys of keyboard 114 were activated. In an example, the keyboard controller 130, the processor 102, or both may receive, from a piezoelectric element, an electric charge and produce an electrical haptic response control signal to the piezoelectric element.

In an embodiment, the haptic feedback keyboard and touchpad control system 132 may also include one or more sets of instructions that, when executed by a processor, adjusts the polarity, voltage, or current of electrical haptic response control signal applied to any piezoelectric element. This adjustment may be completed based on the desired haptic responses from the piezoelectric elements, the lifespan of the piezoelectric element, the electrical characteristics of the piezoelectric element, the mechanical characteristics of the piezoelectric element, or combinations thereof. Because these characteristics may be different from one piezoelectric element to the other, the electrical haptic response control signal applied any given piezoelectric element by the keyboard controller 130 may be customized to produce a specific level of haptic feedback at any given key of keyboard 114. In an embodiment, the keyboard controller 130 of the information handling system 100 may include a look-up table. In this embodiment, the keyboard controller 130 of the information handling system 100 may access the look-up table in order to determine how an electrical haptic response control signal is to be applied to any given piezoelectric element and at what polarity or voltage of the electrical haptic response control signal to the piezoelectric elements.

The one or more sets of instructions of the haptic feedback keyboard and touchpad control system 132 may also include one or more sets of instructions that, when executed by the keyboard controller 130, causes any number of subsequent current pulses to be applied to any piezoelectric element. In this embodiment, the subsequent electrical pulses may cause a haptic feedback event to a user who actuated a key of keyboard 114 or changes in magnitude, polarity, frequency, or pulses of haptic feedback to emulate the feel of a mechanical keystroke including adjustment of the feel of depth of the haptic-emulated keystroke or some other haptic feedback event. In other embodiments, the haptic feedback of the keyboard 114 may not need to emulate a keystroke of a mechanically actuated keyboard but instead provide a distinct haptic feel to indicate that a keystroke has occurred on the solid-state keyboard 114 to the user.

In an embodiment, the application of any current and voltage applied to any of the piezoelectric elements associated with any of the keys of keyboard 114 may be dependent on an application being executed by the processor 102. By way of example, a user may be engaged in providing input, via the keys of the keyboard 114, to a processor 102 in order to cause output to be provided. In a specific embodiment, the information handling system 100 may execute a basic input/output system (BIOS). Upon execution of the BIOS, the haptic feedback keyboard and touchpad control system 132 may begin to detect electrical signals or charges emitted from a piezoelectric element being placed in a strain by the actuation of a corresponding key on the keyboard 114. This may allow the haptic feedback keyboard and touchpad control system 132 to receive input at times when the information handling system 100 is in an on state. In an alternative embodiment, the execution of other application programs by a processor 102 of the information handling system 100, such as word processing application program may trigger the haptic feedback keyboard and touchpad control system 132 to begin to detect the electrical charges produced at any given piezoelectric element. By deferring input received from the piezoelectric element at the keyboard controller 130 or any other controller or processor, accidental input may be prevented by any errant touch of the keyboard 214.

In an embodiment, the haptic feedback keyboard and touchpad control system 132 may communicate with the main memory 104, the processor 102, the video display 110, the alpha-numeric input device 112, and the network interface device 120 via bus 108, and several forms of communication may be used, including ACPI, SMBus, a 24 MHZ BFSK-coded transmission channel, or shared memory. Keyboard driver software, firmware, controllers and the like may communicate with applications on the information handling system 100.

In other embodiments, dedicated hardware implementations such as application specific integrated circuits, programmable logic arrays and other hardware devices may be constructed to implement one or more of the methods described herein. Applications that may include the apparatus and systems of various embodiments may broadly include a variety of electronic and computer systems. One or more embodiments described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

When referred to as a "system", a "device," a "module," a "controller," or the like, the embodiments described herein may be configured as hardware. For example, a portion of an information handling system device may be hardware such as, for example, an integrated circuit (such as an Application Specific Integrated Circuit (ASIC), a Field Programmable Gate Array (FPGA), a structured ASIC, or a device embedded on a larger chip), a card (such as a Peripheral Component Interface (PCI) card, a PCI-express card, a Personal Computer Memory Card International Association (PCM-CIA) card, or other such expansion card), or a system (such as a motherboard, a system-on-a-chip (SoC), or a stand-alone device). The system, device, controller, or module may include software, including firmware embedded at a device, such as an Intel® Core class processor, ARM® brand processors, Qualcomm® Snapdragon processors, or other processors and chipsets, or other such device, or software capable of operating a relevant environment of the information handling system. The system, device, controller, or module may also include a combination of the foregoing examples of hardware or software. In an embodiment an information handling system 100 may include an integrated circuit or a board-level product having portions thereof that may also be any combination of hardware and software. Devices, modules, resources, controllers, or programs that are in communication with one another need not be in continuous communication with each other, unless expressly specified otherwise. In addition, devices, modules, resources, controllers, or programs that are in communication with one another may communicate directly or indirectly through one or more intermediaries.

Figure 2A:
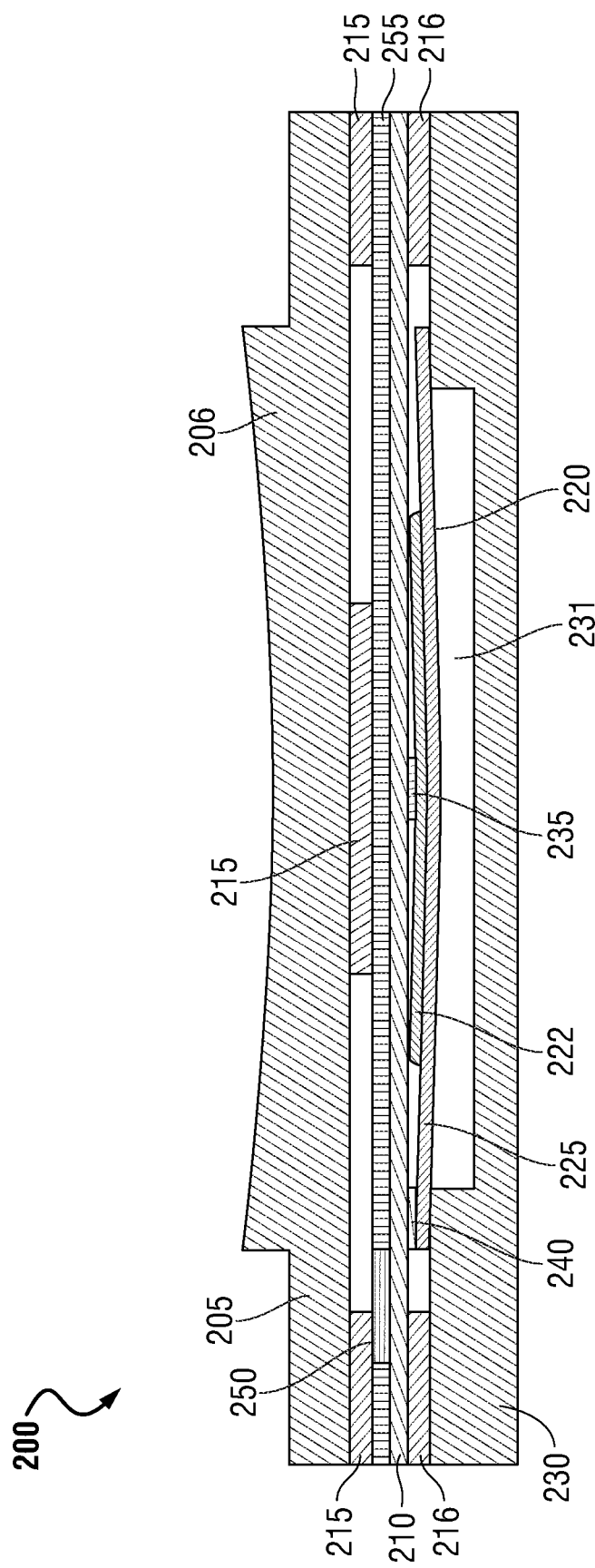
FIG. 2A is a side cut-out view of a key of a portion of a keyboard implementing a piezoelectric element and backlighting according to an embodiment of the present disclosure.
Figure 2B:
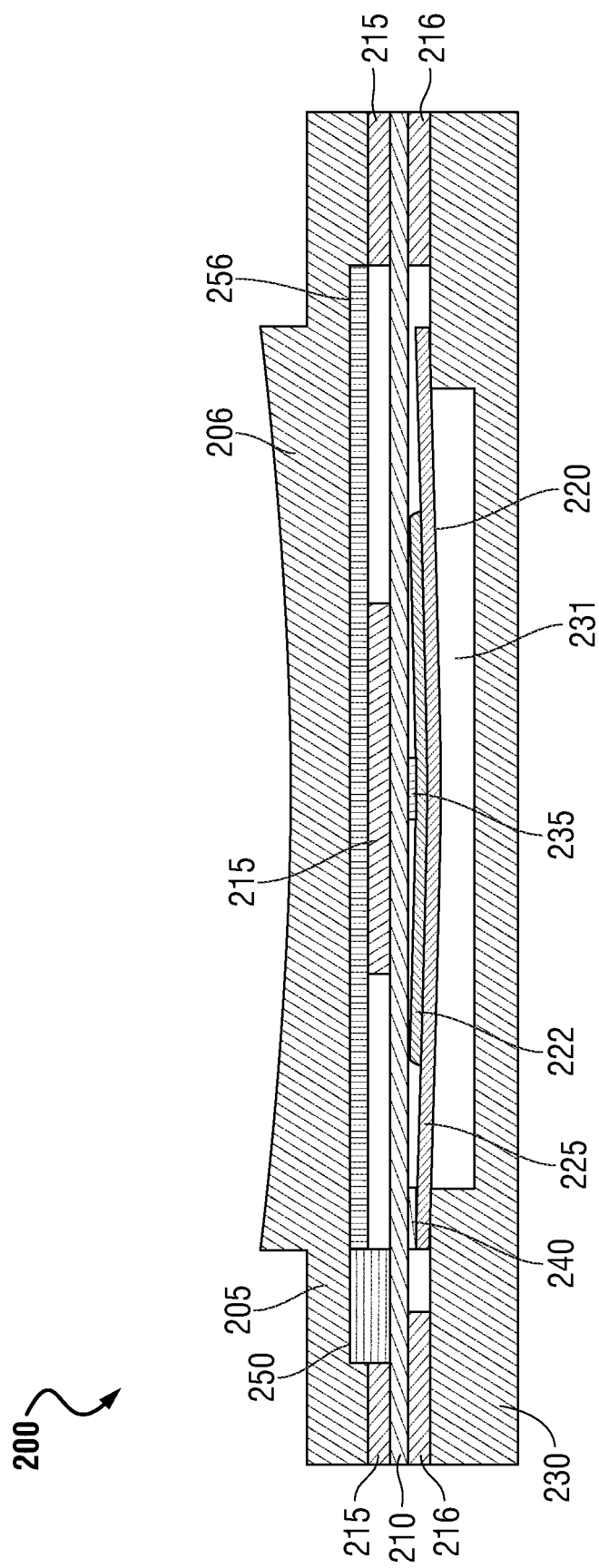
FIG. 2B is a side cut-out view of a key of a portion of a keyboard implementing a piezoelectric element and backlighting according to another embodiment of the present disclosure.
Figure 2C:
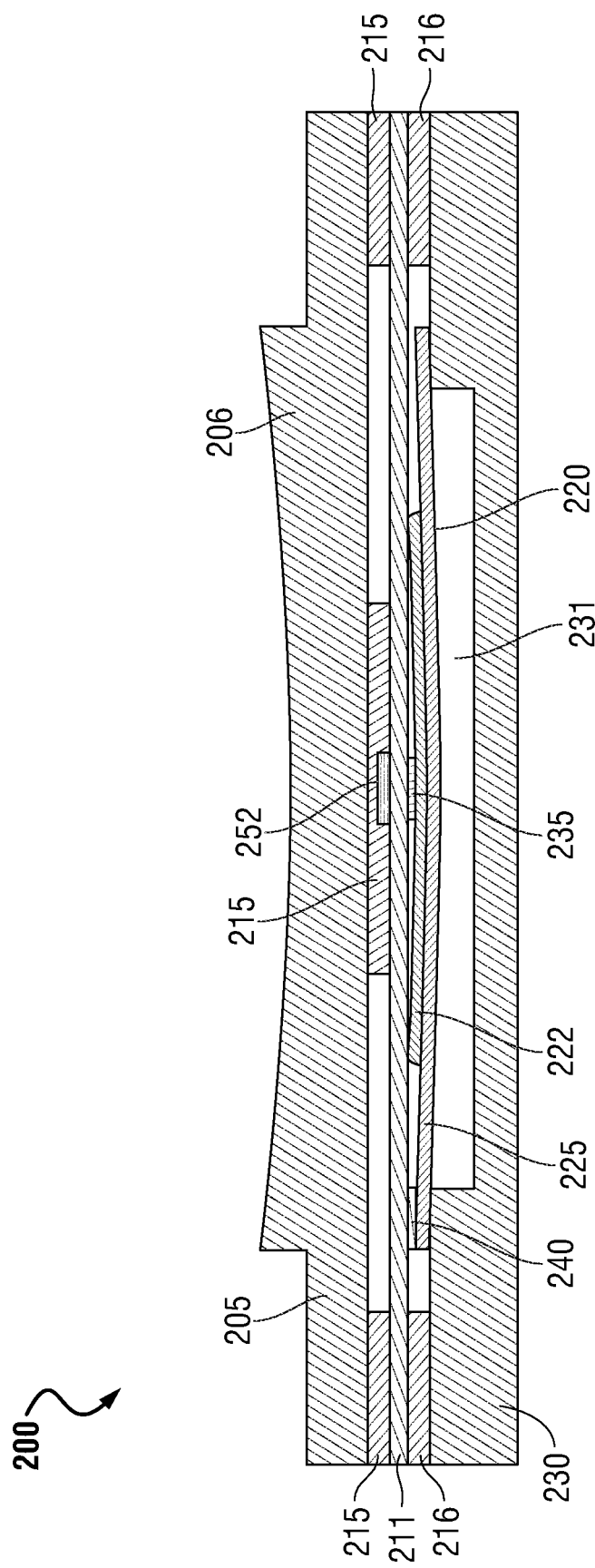
FIG. 2C is a side cut-out view of a key of a portion of a keyboard implementing a piezoelectric element and backlighting according to yet another embodiment of the present disclosure.

FIG. 2A, FIG. 2B, and FIG. 2C are side cut-out views of a key 200 of a backlit keyboard implementing a piezoelectric element and light emitting diode according to a plurality embodiments of the present disclosure. FIG. 2A depicts a dual use contact foil layer used with a separate light guide in a haptic key stack up of layers under a coversheet in an embodiment. FIG. 2B depicts a dual use contact foil layer used with a light guide layer etched into a coversheet layer of a haptic key stack up of layers in another embodiment. FIG. 2C depicts a dual use contact foil layer that incorporates a micro-LED within the contact foil layer in another embodiment. FIG. 2A, FIG. 2B, and FIG. 2C share several similar layers otherwise as described herein. In the embodiments of the present disclosure, one or more layers of the keyboard in embodiments of the present disclosure may provide a dual purpose as part of the piezoelectric system described above, and as part of a backlighting system emitting light through translucent portions of the keyboard coversheet. Such dual-purposing of one or more layers may decrease the thickness and weight of the combined piezoelectric keyboard and backlighting systems in an embodiment.

According to an embodiment, the key 200 may be formed of a plurality of layers, one layer of which is a piezoelectric element 220. Although FIG. 2A, FIG. 2B, and FIG. 2C show a cross-sectional view of a single key 200, the present specification contemplates that a keyboard may also include a plurality of these similar keys 200 arranged as, for example, a QWERTY-type keyboard. Consequently, the embodiments of FIG. 2A, FIG. 2B, and FIG. 2C are not intended to be limiting but merely intended as a description of operation of any type of input device contemplated by the present disclosure.

The key 200 includes a coversheet 205. The coversheet 205 may be made of any type of elastically resilient material. The elastically resilient material may allow, at least, a portion of the key 200 to be deformed upon application of a pressure from a user's finger. Upon withdrawal of the pressure from the user's finger, the material the coversheet 205 is made of allows the coversheet 205 of the key 200 to bend back to its pre-deformed state. In an embodiment, the resilient material may allow the coversheet 205 to travel a minimal distance and still deform a piezoelectric element 220. For example, a distance of between 0.01 mm and 2 mm. In an embodiment, the distance is between 0.05 mm and 0.15 mm. In an embodiment, the distance is 0.1 mm.

In an embodiment, the shape of the coversheet 205 may have a selection of key pedestals 206 of various sizes and shaped so as to conform to a user's finger. In an embodiment, in order to shape the coversheet 205, the material used to form the coversheet 205 may be subjected to an injection molding process. As such, a top portion of the coversheet 205 may be formed to be ergonomically beneficial to a user's actuation such as by conforming to the user's fingers and including a pedestal 206 to highlight the key location, for example. In other embodiments, no key pedestals may be formed and a key location may be described in coversheet 205 via markings, depressions, key framing, or other methods. The injection molding process may be completed prior to the installation of the coversheet 205 into the remaining layers within the keyboard 200 as described herein. Any number of processes may be included with the injection molding process. In an embodiment, the injection molding process used to form the coversheet 205 may include forming a number of holes within a translucent sheet of acrylonitrile butadiene styrene (ABS). These holes may correlate with a number of keys on a keyboard. The formation of the coversheet 205 may continue with injection molding a translucent ABS through the holes to form a raised portion correlating with each of the number of keys on the keyboard. Opposite the raised portions a number of runners may be machined away to accommodate for receipt of other layers of the keyboard such as each of the piezoelectric elements. The surface of the coversheet on which the raised portions are formed may be painted and any number or type of graphics may be laser etched on each raised portion indicating a specific key of the keyboard. At least some portions of the translucent ABS may be left unpainted, such that the coversheet remains translucent throughout its thickness (e.g., between the top and bottom surfaces of the coversheet 205). These translucent portions of the coversheet 205 may allow for the passage of light emitting from light emitting diodes in an embodiment.

In other embodiments, the coversheet of the C-cover may include a plurality of vias for keys 200 having a cover sheet 205 or cap for each key. A key pedestal 206 for each key 200 in a solid-state keyboard of the present embodiments may be disposed through the vias in the C-cover in such embodiments. Each haptic key of the haptic keyboard in such an embodiment may include a cover layer with translucent portions similar to those described directly above that protrudes through the key vias in the coversheet 205. Layering under the coversheet may include material layers that are hydrophobic or have other properties. Though gaps between haptic keys and key vias may be minimized, such gaps may be useful for cooling ventilation of the base chassis or for allowing backlighting to frame the haptic keys. Similarly, a touchpad top touch interface layer may be attached under the coversheet 205 to seamlessly provide a designated touchpad area in the C-cover coversheet 205. Any combination of at least partially translucent, continuous coversheet for haptic keys and vias in the coversheet for placement of haptic keys of a partially translucent keyboard coversheet layer are contemplated in various embodiments. Further, it is contemplated that in some embodiments one or the other of a haptic keyboard or haptic touchpad may be used with a keyboard having mechanically actuated, partially translucent keys or a touchpad with a mechanically actuated diving board mechanism.

In one example embodiment as shown in FIG. 2A, the key 200 may further include a number of adhesive layers 215 that physically couple the various layers of the key 200 together. In an embodiment, a first adhesive layer 215 may be formed on the coversheet 205 to adhere the coversheet 205 to one or more light emitting diodes (LEDs) 250, and a light guide layer 255. The first adhesive layer 215 may include the placement of the adhesive at locations that may enhance the movement and prevent the hindrance of the actuation of the coversheet 205. In a specific embodiment, the first adhesive layer 215 may include placing the adhesive along borders of the key 200 as well as placing the adhesive at a central location of the key 200.

In embodiments of FIG. 2B, the coversheet 205 may include an etched portion for a light guide layer 256 of the coversheet 205. The light guide layer 256 of the coversheet in the embodiment of FIG. 2B may include one or more LEDs 251 for illuminating the translucent portions of the coversheet 205 as backlighting.

In embodiments of FIG. 2C, the contact foil layer 210 may include unpackaged, mini, or micro light emitting diodes (LEDs) 252 incorporated within the contact foil layer 210 and situated directly beneath the key pedestal 206. Micro LEDs 252 in an embodiment may comprise microscopic light emitting diodes that eliminate the packaging of other LEDs and are a silicon chip light emitting diode with a protective layer coating in some cases small enough to each make up the individual components of a single pixel for example. The contact foil 210 may include a number of metal traces formed on its top surface (e.g., surface of the contact foil 210 situated closest the coversheet 205) that electrically and communicatively couple each of a plurality of unpackaged, mini, or micro LEDs 252 directly adhered to the surface of the contact foil 210 and, thus, to an LED controller or a processor of an information handling system. Such micro LEDs 252 may extend only 0.05 mm above the top surface of the contact foil 210 in some embodiments. The micro LEDs 252 may be provided a transparent coating or protective layer and may illuminate the keys from underneath without a need for a light guide layer to distribute light across under the surface of the key coversheet or keyboard.

The LED 250 or 251 of FIG. 2A or 2B, or micro LEDs 252 in FIG. 2C in embodiments herein may emit light of varying intensities and colors, dependent upon electrical signals received at the LED 250 or 251 or micro LEDs 252 from an operably connected LED controller (not shown). In some embodiments, the LED 250 or 251 or micro LEDs 252 may emit light in only one color, or one intensity, and the LED controller (not shown) may operate to place the LED 250 or 251 or micro LEDs 252 in an off or on state only. In the embodiment shown in FIG. 2A, the LED 250 in an embodiment may be embedded within a light guide layer 255 that operates to redirect light emitting omnidirectionally from the LED 250 toward translucent portions of the coversheet 205. The light guide layer 255 in an embodiment may be formed using an injection molding process that includes forming a single translucent ABS layer. A portion of the light guide layer 255 may then be machined away to accommodate insertion of the LED 250 within the ABS light guide layer 255. Portions of the translucent ABS light guide layer 255 may then be machined away to form vias through which light emitted from the LED 250 may be guided toward the one or more translucent portions of the coversheet 205 or key pedestal 206 through which light will be emitted. In alternative embodiments, the light guide layer 255 may be formed of a nano-imprinted light guide film. In still other embodiments similar to the embodiment shown in FIG. 2B, the light guide layer 255 may be omitted, and portions of the bottom surface of the coversheet 205 may be machined away to form vias through which light emitted from the LED 251 may be guided via a light guide portion 256 of the coversheet 205 toward the one or more translucent portions of the coversheet 205 or key pedestals 206 through which light will be emitted. In such an embodiment, the LED 251 may be adhered directly to the bottom surface or partially inserted within the coversheet 205 with the etched light guide layer 256. In still other embodiments similar to the embodiment shown in FIG. 2C, a light guide layer may be omitted from the key 200 entirely. In such an embodiment, the use of a micro LED 252 situated directly beneath the key pedestal 206 may negate the need for such a light guide layer, because direct placement of the micro LED 252 beneath the key pedestal 206 may result in automatic emission of light from the micro LED 252 through the translucent portions of the key pedestal 206.

Returning to either embodiment of FIG. 2A or FIG. 2B, the contact foil 210 may be situated directly beneath the light guide layer 255 to the light and may be made of any elastically resilient material that, when the coversheet 205 of key 200 is actuated or the contact foil 210 is bent towards a lower portion of the key 200, returns to its original state when the key 200 is no longer being actuated. The contact foil in an embodiment may be a flexible material, such as polyethylene terephthalate (PET) serving as a polyester printed circuit board or other type of flexible printed circuit board, in several example embodiments. The contact foil 210 may include a number of metal traces formed on its top surface (e.g., surface of the contact foil 210 situated closest the coversheet 205) that electrically and communicatively couple each of the corresponding LEDs 250 or 251 of key 200 to an LED controller or a processor of an information handling system. Embodiments contemplate a plurality of metals used to create such metal traces. For example, in an embodiment in which the contact foil 210 is comprised of polyester, the metal traces may comprise silver printed upon the polyester. As another example, in an embodiment in which the contact foil 210 is a flexible printed circuit board (FPC), the metallic traces may comprise copper printed upon the FPC. The contact foil 210 may also include a number of metal traces formed on its bottom surface (e.g., surface of the contact foil 210 situated closest the support plate 230) that electrically and communicatively couple each of the corresponding piezoelectric element 220 of key 200 to a keyboard controller such as a processor of an information handling system that includes a haptic feedback keyboard control system such as described herein. Formation of metal traces may be made according to a variety of methods including photolithographic techniques for applying metal or lamination of copper strips or other metal layers.

In an embodiment, portions of the contact foil 210 may be physically coupled to a support plate 230 via a second layer of adhesive 216. The location of the placement of the second adhesive layer 216 may include placing the adhesive along borders of the key 200.

In an embodiment presented herein, the piezoelectric element 220 may include a first portion 222 that may be any solid piezoelectric material that accumulates an electric charge when a mechanical stress is applied to it or specifically, in the embodiments presented herein, when the solid material is deformed. Solid materials used to form the piezoelectric element 220 may include crystals, ceramics, or protein layers, among other types of materials. For ease of explanation, the piezoelectric element 220 may be made of a type of ceramic although the present specification contemplates the use of other types of piezoelectric materials.

The piezoelectric element 220 may be housed over a cavity 231 formed in the support plate 230. The piezoelectric element 220 may comprise two portions 222 and 225 each electrically coupled via electric contact points such as soldering points 235 and 240, respectively, to a different electrical trace on the bottom surface of the contact foil 210. The first portion 222 may be a ceramic disc in an embodiment. Second portion 225 of the piezoelectric element 220 may be a metal plate or ring, such as a brass plate, that extends beyond the edges of cavity 231. The first portion 222 and the second portion 225 may be operatively coupled via adhesive including conductive adhesives. The soldering points 235 and 240 may be silver solder contact points for operative electrical coupling to metal traces on the bottom surface of contact foil 210. As so oriented, the first soldering point 235 and second soldering point 240 may be formed to receive an electrical charge upon deflection of the piezoelectric element 220 as a user actuates the key 200. The brass plate 225 supports deflection of the piezoelectric element 220 into the cavity 231 to detect mechanical actuation of the key 200. In an embodiment, the support plate 230 may have a cavity 230 formed therein such that the piezoelectric element 220 may be allowed to be deflected therein when the key 200 is actuated by a user and cavity 231 may be an aperture or hole through support plate 230 or may be a depression or hole in support plate 230 that does not pass through 230.

In an embodiment presented herein, the first portion 222 of the piezoelectric element 220 may be any solid material that accumulates an electric charge when a mechanical stress is applied to it or specifically, in the embodiments presented herein, the solid material is deformed. Solid materials used to form the piezoelectric disk 222 or other piezoelectric material as part of a first portion 222 of the piezoelectric element 220 may include crystals, ceramics, biological matter, protein layers, among other types of materials. For ease of explanation, the piezoelectric disk material 222 may be made of a type of ceramic although the present specification contemplates the use of these other types of materials.

During operation of the key 200, the contact foil 210 may receive an electrical charge from the piezoelectric element 220 at the metal traces on the bottom surface of the contact foil 210 that conduct the electrical charge to the processor or other keyboard controller associated with the key 200. For example, as the piezoelectric disk material 222 is compressed by deflection and the metal plate or ring 225 warped downward toward the cavity 231 within support plate 230, a change in voltage may be detected. The electrical charge created when the user actuates the key 200 and the piezoelectric element 220 is subjected to a mechanical stress may be detected between soldering points 235 and 240. The electrical charge may be communicated down metal traces formed on the contact foil 210 to a controller (not shown).

The metal traces formed on the contact foil 210 may further be used to conduct a return electrical haptic response control signal from the controller to the piezoelectric element 220 so that the voltage and current polarity and magnitude of the return electrical haptic response control signal may cause the piezoelectric element 220 to warp upward or downward and return to a planer state as required to cause a specified haptic response event to the user via coversheet 205. For example, this electrical haptic response control signal may have a certain voltage, current, and polarity (−,+) sufficient to render the piezoelectric material of the piezoelectric element 220 to cause a haptic event or sound. Such a response signal may be a sine wave, a square wave, a pulsed signal, or other waveform of changing current, voltage, or polarity applied to the piezoelectric element 220. This stretching or compression of the first portion of the piezoelectric element 220 may cause the warping of the metal plate portion 225 for the haptic feedback event presented at the key 200 via the contact foil 210, adhesive 215, and coversheet 205 that the user may feel. Upon receiving an actuation signal, the controller sends the electrical haptic response control signal back to the piezoelectric element 220 via the metal traces formed on the contact foil 210, through the soldering points 235 and 240 and to a conductive layer of metallic plate or ring 225 and the piezoelectric disk material 222.

The traces in the contact foil layer and the metallic plate or ring 225 may apply the electrical haptic response control signal to the piezoelectric disk material 222 so as to cause the piezoelectric disk material 222 to stretch or shrink depending on the polarity of the signal applied. For example, a negative signal applied to piezoelectric disk material element 222 relative to the charge at adhesively attached metallic plate 225 may cause piezoelectric disk 222 to expand or stretch in embodiments herein. This may cause metallic plate 225 to warp downward. Reversing polarity to the piezoelectric disk 222 may cause the piezoelectric disk 222 to compress or shrink and metallic plate 225 may warp upwards. The principle of haptics applied to the piezoelectric disk 222 includes an input voltage that is applied through the two electrodes (voltage change as sine wave, square wave etc.) to generate movement on piezoelectric material 222 of the piezoelectric element 220 and a warping of the metallic layer or disk 225. This haptic response signal is used to cause a haptic tactile feedback such as a depression and return of the key 200 or a haptic "click" of a touchpad and which may be accompanied by a sound. Such an electrical haptic response control signal, such as a sine wave signal, or other haptic response signals with varying polarities or voltage and current may be used by the keyboard controller to create the haptic feedback felt by the user as described herein. In these embodiments, the electric charge sent from the piezoelectric element 220 to the keyboard controller and the electrical haptic response control signal sent from the controller to the piezoelectric element 220 may propagate along the two metal traces formed on the bottom surface of the contact foil 210. The contact foil 210 may therefore, in an embodiment, include double the number of metal traces on its bottom surface as that of the number of piezoelectric elements 220 used to form a keyboard that includes multiple keys 200. This haptic feedback may be relayed to the user within microseconds of the user actuating the key 200 such that the user physically detects a sensation that the key 200 was pressed. This sensation felt by the user may be present despite no actual mechanical devices such as a scissor mechanism or other types of keyboard mechanical devices being present among the layers of the key 200. The signal to the piezoelectric element 220 may vary magnitude and pulsing to create the desired haptic response at key 200.

As described, the embodiments of FIG. 2A, FIGS. 2B, and 2C show an image of a single key 200. The present specification contemplates that a plurality of keys 200 may be formed, however, alongside each other in order to form a piezoelectric keyboard. For example, piezoelectric keyboard may comprise a number pad, a keyboard, a set of function keys, or a combination thereof. Consequently, although the features of the key 200 depicted in FIG. 2A, FIG. 2B, and FIG. 2C apply to a single key 200, the present specification contemplates that any number of keys 200 may be formed on the keyboard so as to allow for the formation of an input device such as a keyboard. The keys 200 may be of any size (e.g., spacebar, tab key, or the like) and depending on size may include more than one piezoelectric element 220 associated with it. As the user actuates each of the keys 200, a haptic feedback may be felt by the user so as to present to the user a sensation that the key was pressed. This operation of key 200 may be conducted every time the user actuates the key 200.

The formation of the key 200 may, in the embodiments presented herein, provide for a keyboard that has a relatively shorter distance of key travel as compared to piezoelectric haptic keyboards that comprise two separate contact foil layers, and as compared to those keyboards that implement mechanical devices such as a scissor mechanisms and key caps. In an embodiment, the distance of travel of the key 200 may be smaller than 0.1 mm or up to 5 mm depending on stiffness of the layers comprising the stack up of the key 200. With the shorter distance of key travel, the overall thickness of the keyboard placed within an information handling system may be reduced. This increases the available depth within a base chassis of, for example, a notebook-type information handling system that may be used for more or larger components (e.g., batteries) to be placed within the base chassis. Additionally, or alternatively, the reduction in thickness of the keyboard may reduce the overall thickness of the information handling system improving the aesthetics of the design of the information handling system. This reduction in size of the information handling system may also result in the reduction of the weight of the information handling system thereby increasing the portability of the information handling system by the user.

The keys 200 of the present embodiments also include no moving mechanical parts. With the absence of mechanical moving parts, the key 200 of the presently described embodiments may be relatively more robust thereby increasing the useful life of the key 200. This may increase user satisfaction over the useful lifetime of the information handling system.

Figure 3:
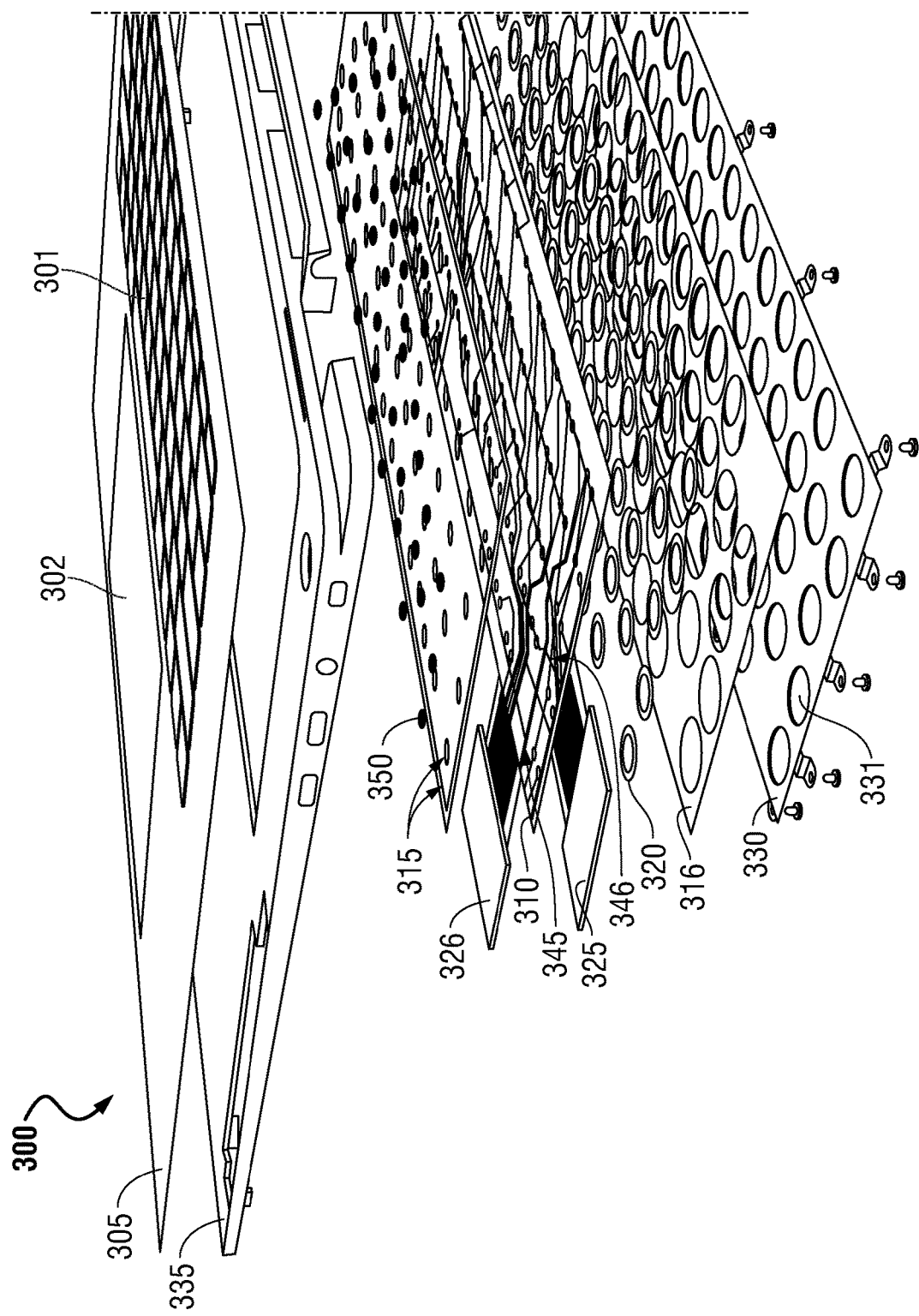
FIG. 3 is an exploded perspective view of a keyboard stack up for of an information handling system according to an embodiment of the present disclosure.

FIG. 3 is an exploded perspective view of a keyboard stack up 300 of an information handling system according to an embodiment of the present disclosure. The keyboard stack up 300 shows a plurality of keys, similar to those described in connection with embodiments of FIG. 2A, FIG. 2B, or FIG. 2C arranged so as to receive input from a user at multiple keys. FIG. 3 also shows a top coversheet 305 having both a keyboard 301 and a touchpad 302. Either or both of the keyboard 301 and touchpad 302 may be haptic systems as described in embodiments herein. In an embodiment, the keys may be arranged similar to a QWERTY design of a keyboard 301. However, other arrangements of any alphabetic, numeric, or symbolic keys is contemplated by the present description.

The keyboard stack up 300 may include several layers similar to those described in connection with either FIG. 2A, FIG. 2B, or FIG. 2C. In an embodiment, the keyboard stack up 300 includes a coversheet layer 305. The coversheet layer 305 may be made of any type of elastically resilient material. Coversheet layer 305 may include a plurality of key designations, such as key pedestals as shown in keyboard 301 and a touchpad 302 area designation. The elastically resilient material may allow, at least, a portion of the coversheet layer 305 to be deformed upon application of a pressure from a user's finger. Upon withdrawal of the pressure from the user's finger, the material the coversheet layer 305 is made of allows the coversheet layer 305 of the key to bend back to its pre-deformed form.

In an embodiment, in order to shape the coversheet 305, the material used to form the coversheet 305 may be subjected to an injection molding process completed prior to the installation of the coversheet 305 into the remaining layers within the keyboard 300 as described herein. Any number of processes may be included with the injection molding process, including forming a number of holes correlated with a number of keys 301 on the keyboard 300 within a translucent sheet of ABS, and injection molding a translucent ABS through the holes to form a raised portion correlating with each of the number of keys 301 on the keyboard 300. Opposite the raised portions a number of runners may be machined away to accommodate for receipt of other layers of the keyboard such as each of the piezoelectric elements 320, or the LEDs 350. At least some portions of the translucent ABS coversheet 305 may be left unpainted or etched to reveal translucent portions, such that the coversheet 305 remains translucent throughout its thickness (e.g., between the top and bottom surfaces of the coversheet 305). These translucent portions of the coversheet 305 may allow for the passage of light emitting from light emitting diodes 350 in an embodiment.

In other embodiments, the coversheet of the C-cover 335 may include a plurality of vias for keys 301 having a cover sheet 305 or cap for each key 301. A key pedestal for each key 301 in a solid-state keyboard of the present embodiments may be disposed through the vias in the C-cover 335 in such embodiments. Each haptic key of the haptic keyboard in such an embodiment may include a cover layer with translucent portions similar to those described directly above that protrudes through the key vias in the coversheet 305. Layering under the coversheet may include material layers that are hydrophobic or have other properties. Though gaps between haptic keys and key vias may be minimized, such gaps may be useful for cooling ventilation of the base chassis or for allowing backlighting to frame the haptic keys. Similarly, a touchpad 302 top touch interface layer may be attached under the coversheet 305 to seamlessly provide a designated touchpad area in the C-cover 335 coversheet 305. Any combination of at least partially translucent, continuous coversheet for haptic keys and vias in the coversheet for placement of haptic keys of a partially translucent keyboard coversheet layer 305 are contemplated in various embodiments. Further, it is contemplated that in some embodiments one or the other of a haptic keyboard or haptic touchpad may be used with a keyboard 300 having mechanically actuated, partially translucent keys 301 or a touchpad 302 with a mechanically actuated diving board mechanism. Any combination of the above coversheet 305 layouts described is contemplated in embodiments described herein.

A bottom surface of the coversheet 305 in an embodiment may be machined away to form a light guide layer such as shown in FIG. 2B. For example, the bottom surface of the coversheet 305 (e.g., surface nearest LEDs 350) may be machined away to accommodate insertion of the LEDs 350 within the ABS coversheet 305 and to form vias through which light emitted from the LEDs 350 may be guided toward the one or more translucent portions of the coversheet 305 or key 301 through which light will be emitted. By machining a light guide pattern directly into the bottom surface of the coversheet 305, embodiments of the present disclosure may incorporate fewer layers of the keyboard stackup 300, resulting in a thinner, more light weight keyboard. In alternative embodiments, the keyboard stackup 300 may include a separate light guide layer situated between the contact foil 315 and the coversheet 305, such as that discussed with reference to FIG. 2A. Such a light guide layer may be formed of an ABS material, or nano-imprinted light guide film.

The keyboard stack up 300 may further include a C-cover substructure 335 forming part of the base chassis with a cutout for keyboard 301 and touchpad 302. The C-cover substructure 335 may be made of a rigid material that prevents little or no movement. The rigidity of the C-cover substructure 335 allows the other layers within the keyboard 301 to be maintained within the information handling system. In an embodiment, the C-cover substructure 335 may be made of a metal.

The keyboard stack up 300, in an embodiment, may further include any number of adhesive layers 315. In an embodiment, a first adhesive layer 315 may mechanically couple the coversheet layer 305 to a plurality of LEDs 350 and a contact foil layer 310 and any additional light guide layer. The first adhesive layer 315 may include the placement of the adhesive at locations that may enhance the movement and prevent the hindrance of the actuation of the coversheet layer 305 at those locations across the coversheet layer 305 where keys are present. In a specific embodiment, the first adhesive layer 315 may include placing the adhesive along borders of each of the keys as well as placing the adhesive at a central location of each of the keys.

The plurality of LEDs 350 in an embodiment may emit light of varying intensities and colors, dependent upon electrical signals received at the LEDs 350 from an operably connected LED controller 325. In some embodiments, the LEDs 350 may emit light in only one color, or one intensity, and the LED controller 325 may operate to place the LEDs 350 in an off or on state only. Each of the LEDs 350 in an embodiment may be situated beneath a single key 301 of the keyboard 300. The LED 350 in an embodiment may be embedded within a bottom surface of the coversheet 305 etched for a light guide or embedded in a separate light guide layer that operates to redirect light emitting omnidirectionally from the LED 350 toward translucent portions of the coversheet 305. The light guide layer under coversheet 350 or the light guide portion of the coversheet 350 in various embodiment may be formed using an injection molding process that includes forming a single translucent ABS layer. In some embodiments such as with FIG. 2B, coversheet layer 305 may be made partially or wholly of translucent polycarbonate material that may be etched along the bottom of the coversheet layer to serve as the light guide layer.

The contact foil layer 310 is adhered to the coversheet layer 305 via the first adhesive layer 315 may be made of any elastically resilient material that, when any given key is actuated or the contact foil layer 310 is bent towards a lower portion of the respective key, returns to its original state when the respective key is no longer being actuated. The contact foil layer 310 may include a number of metal traces 346 formed on a top surface (e.g., surface nearest the LEDs 350) of the contact foil layer 310 that electrically and communicatively couples each of a plurality of light emitting diodes 350 to a light emitting diode (LED) controller 325 of an information handling system. In an embodiment, the LED controller 325 may be a dedicated LED controller 325 communicatively coupled to the contact foil layer 310 so as to transmit electrical signals controlling functionality of each of the plurality of LEDs 350, either as a group, or separately. In an alternative embodiment, the LED controller 325 may be wholly or partially controlled by an LED controller or other processor of the information handling system that executes computer readable program code of LED backlight controls in example embodiments.

The contact foil layer 310 in some embodiments, such as the embodiment shown in FIG. 2C, may incorporate an array of micro LEDs, where each micro LED is situated directly beneath a key of the keyboard 301. The metal traces 346 formed on the top surface of the contact foil layer 310 in such an embodiment may electrically and communicatively couples each of the array of micro LEDs to the light emitting diode (LED) controller 325. Positioning of each micro LED directly beneath an individual key of the keyboard 301 in such an embodiment may negate the need for a light guide layer anywhere within the keyboard stackup 300, resulting in reduced thickness of the overall stackup 300.

The contact foil layer 310 may also include a number of metal traces at 345 on contact foil layer 310 formed on the bottom surface (e.g., surface nearest support plate 330) of the contact foil layer 310 that electrically and communicatively couples each of the keys and a corresponding piezoelectric element 320 to a keyboard controller 326 of an information handling system that includes a haptic feedback keyboard control system such as described in connection with FIG. 1. The bottom metal traces 345 operatively couple to the piezoelectric element 320 (or 220) as shown in FIG. 2A, FIG. 2B, or FIG. 2C via solder points 235 and 240 shown there. Thus, a top surface of the contact foil 310 in an example embodiment may include traces 346 on contact foil layer 310 operatively coupling a plurality of LEDs 350 to an LED controller 325, while the bottom surface of the contact foil 310 may include additional traces shown at layer 345 operatively coupling the plurality of piezoelectric elements 320 to a keyboard controller 326. In an embodiment, the keyboard controller 326 may be a dedicated controller communicatively coupled to the contact foil layer 310 so as to detect electrical charges from each of the piezoelectric elements 320 and provide electrical haptic response control signals back to the respective piezoelectric elements 320. Keyboard controller in some embodiments may execute some or all computer readable program code associated with the haptic feedback keyboard control system as described in FIG. 1 In an alternative embodiment, some or all of the keyboard controller 326 may be a processor of the information handling system that, among other computations and execution of other computer readable program code, also executes computer readable program code associated with the haptic feedback keyboard control system as described in FIG. 1. Such a dual-use of the single contact foil 310 (e.g., to electrically couple the LEDs 350 to the LED controller 325 and to electrically couple the piezoelectric elements 320 to the keyboard controller 326) may obviate the need for two separate contact foil layers, thus decreasing the thickness and weight of the keyboard stackup 300.

During operation of each key on the keyboard 301, the contact foil layer 310 may receive an electrical charge from the respective piezoelectric elements 320 as they are compressed upon actuation at the metal traces 345 that conduct the electrical charge to the controller 325 associated with the keyboard 300. The metal traces 345 formed on the bottom of contact foil layer 310 may further be used to conduct a return electrical haptic control response signal from the controller 325 to the piezoelectric elements 320 so that the piezoelectric elements 320 will stretch or contract in response to a control haptic feedback signal and at varying polarities, voltages, or currents. This electrical haptic response control signal to each of the actuated piezoelectric elements 320 may cause a haptic feedback event via upward or downward warping of the piezoelectric element 320 and presented at each of the keys that the user may feel. This haptic feedback may be relayed to the user within microseconds of the user actuating any of the keys on the keyboard 301 such that the user physically detects a sensation that the key was pressed. This sensation felt by the user may be present despite no actual mechanical devices such as a scissor mechanism or other types of keyboard mechanical devices being present among the layers of the keyboard 301.

The keyboard stack up 300 may further include a second adhesive layer 316 that mechanically couples the contact foil layer 310 to a support plate 330. In an embodiment, the second adhesive layer 316 may include the placement of an adhesive along borders of each piezoelectric element 320 of the keyboard stack up 300. As shown in FIG. 3, the second adhesive layer 316 includes circular voids that conform to a shape of each piezoelectric element 320 within the keyboard stack up 300.

The support plate 330 may be made of rigid material such as a metal. The support plate 330 prevents deformation of the keyboard stack up 300 except for, in some embodiments, the contact foil layer 310, piezoelectric element 320, first adhesive layer 315, and second adhesive layer 316 as for operation of the haptic keys. As such, the contact foil layer 310 may be allowed to detect the deformation of the piezoelectric elements 320. Additionally, a user using the keyboard 301 may feel a level of rigidity in the keyboard 301 except that at the locations of the keys where the user has expected that some level of deformation occurs when pressure is applied to provide for key actuation of the piezoelectric element 320.

In an embodiment, the support plate 330 may include a number of cavities 331 formed therein. The cavities 331 may be sized to have a relatively smaller diameter than the diameter of each of the respective piezoelectric elements 320. By including these cavities 331, the piezoelectric elements 320 may be allowed to be deformed into the cavities 331 so that the deformation of the piezoelectric element 320 creates the electrical charge described herein. The metal plate of the piezoelectric elements 320 may have a diameter greater than cavities 331. Upon compression or contraction of the piezoelectric material portions, such as a ceramic disk of the piezoelectric element 320, the metal plate may warp into or away from the cavity 331. The depth of the cavities 331 may also be selected to allow for at least a central portion of each piezoelectric element 320 to be deflected into the cavities 331 some distance. This distance of deflection, in an embodiment, may be 0.1 mm or smaller or may be greater. In an embodiment, the cavities 331 may also be holes punched or machined through the support plate 330.

In an embodiment, the support plate 330 may be secured to other rigid elements of the information handling system. In an embodiment, the support plate 330 may be secured to the C-cover substrate 335 via a number of bolts, screws, or other mechanical or chemical coupling device. In some embodiments, the support plate 330 may be operatively coupled to the D-cover of the information handling system. The C-cover and D-cover assembly may form a base chassis also housing other components of an information handling system such as a CPU, GPU, memory, power and battery systems, wireless adapter, motherboards, graphics boards, other input/output systems and the like such as the components described with respect to FIG. 1.

Figure 4:
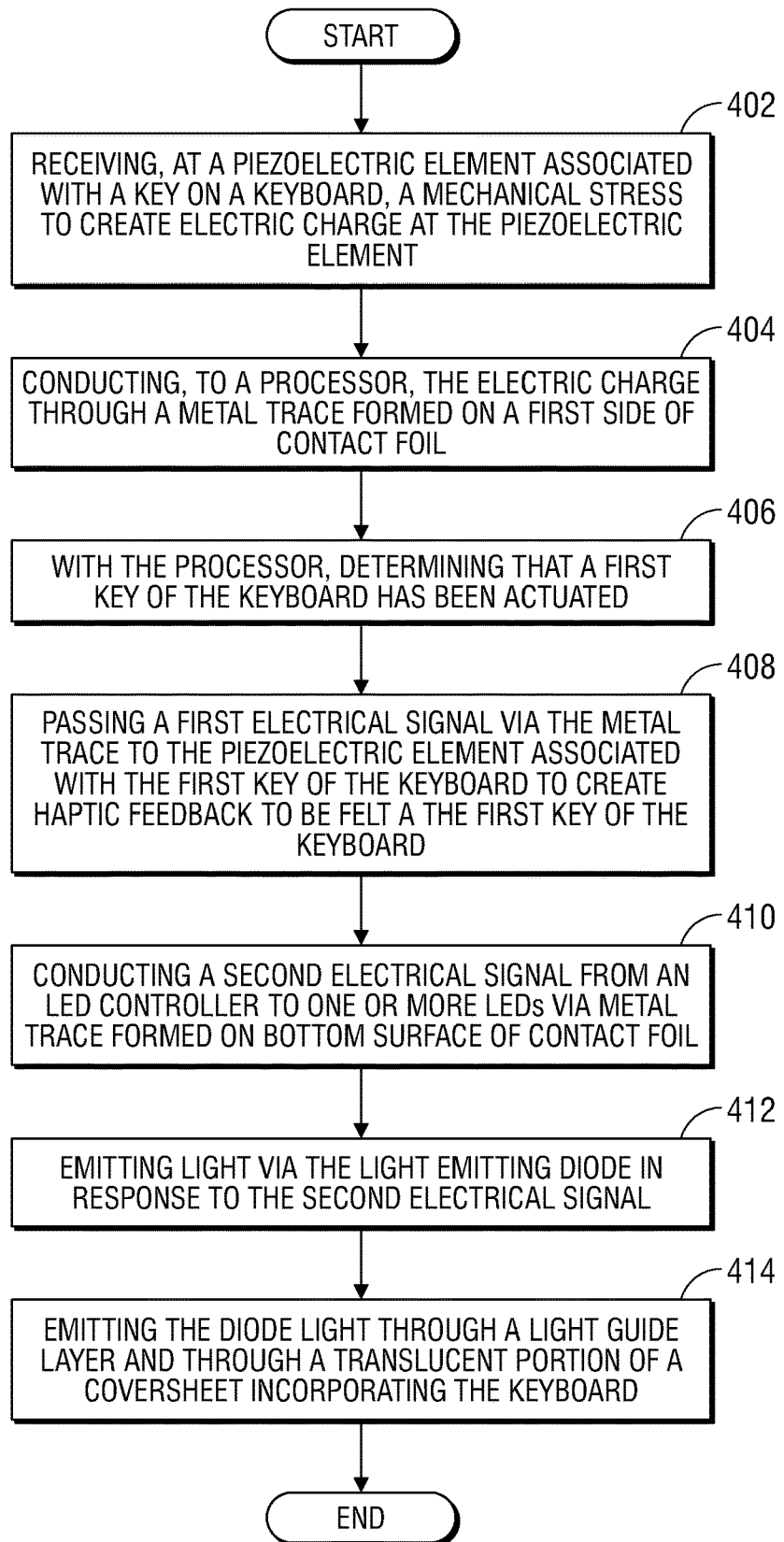
FIG. 4 is a flow diagram illustrating a method of operating a light emitting diode backlit keyboard of an information handling system according to embodiments of the present disclosure.

FIG. 4 is a flow diagram illustrating a method of operating a light emitting diode backlit haptic keyboard of an information handling system according to an embodiment of the present disclosure. As described herein, in order to decrease the thickness and weight of the keyboard and laptop base, one or more layers of the keyboard in embodiments of the present disclosure may provide a dual purpose as part of the piezoelectric system described above, and as part of a backlighting system emitting light through translucent portions of the keyboard coversheet. The method illustrated in FIG. 4 describes operation of one or more layers of the combined keyboard/backlighting systems in such dual-capacities according to embodiments herein.

The method may begin by receiving, at a piezoelectric element associated with a key on a keyboard, a mechanical stress to create an electric charge at the piezoelectric element at block 402. For example, in an embodiment described with reference to FIG. 2A, FIG. 2B, or FIG. 2C, a piezoelectric element 220 may be situated beneath a key pedestal 206. The piezoelectric element 220 in an embodiment may include a first portion 222 comprising a solid material (e.g., crystals, ceramics, biological matter, protein layers) that accumulates an electric charge when a mechanical stress is applied to it or when the solid material is deformed. The piezoelectric element 220 may be housed over a cavity 231 formed in the support plate 230. A mechanical stress applied to the key pedestal 206, and thus, to the piezoelectric element 220 may cause deformation of the ceramic disc 222 and the metal plate or ring 225 comprising the piezoelectric element 220 into the cavity.

The method may continue, at block 404, with conducting, to a processor, the electrical charge through a metal trace formed on a contact foil. For example, in an embodiment described with reference to FIG. 2A, FIG. 2B, or FIG. 2C, the piezoelectric element 220 may be electrically and communicatively coupled at a first portion 222 to a metallic trace formed on a bottom surface of a contact foil 210 by a first soldering point 235 and at a second portion 225 to a metallic trace in contact foil 210 via a second soldering point 240. The first soldering point 235 and second soldering point 240 may be formed to receive an electrical charge upon deflection of the piezoelectric element 220 as a user actuates the key 200. The contact foil 210 may include a number of metal traces formed on its bottom surface that electrically and communicatively couple each of the corresponding piezoelectric elements 220 of key 200 of the keyboard to a controller or a processor of an information handling system that includes a haptic feedback keyboard control system such as described herein. During operation of the key 200, the contact foil 210 may receive an electrical charge from the piezoelectric element 220 at the metal traces that conduct the electrical charge to the processor or other keyboard controller associated with the key 200. For example, as the piezoelectric disk material 222 is compressed by deflection and the metal plate or ring 225 warped downward, a change in voltage may be detected. The electrical charge created when the user actuates the key 200 with the user's finger and the piezoelectric element 220 is subjected to a mechanical stress may be detected between soldering points 235 and 240. The electrical charge is communicated down metal traces formed on the bottom surface of the contact foil 210 to a keyboard controller.

The method may continue at block 406 with determining via the haptic keyboard controller or another processor, that a first key of the keyboard has been actuated. This determination may be made based on the electrical charge signal that the processor receives from one or more specific metal traces formed on the bottom surface of the contact foil. Alternative embodiments may be used to allow the keyboard controller or another processor to determine which key on the keyboard generated the electrical charge. For example, in an embodiment described with reference to FIG. 3, the contact foil layer 310 may include a number of metal traces formed on its bottom surface that electrically and communicatively couple each of the keys and a corresponding piezoelectric element 320 to a keyboard controller 325 of an information handling system that includes a haptic feedback keyboard control system such as described in connection with FIG. 1. In an embodiment, the keyboard controller 325 may be a dedicated controller 325 communicatively coupled to the metal traces formed in the bottom surface of the contact foil layer 310 so as to detect electrical charges from each of the piezoelectric elements 320 and provide electrical haptic response control signals back to the respective piezoelectric elements 320. Keyboard controller 325 executes some or all of the computer readable program code associated with the haptic feedback keyboard control system as described in FIG. 1. In an alternative embodiment, the keyboard controller 325 may be a processor of the information handling system that, among other computations and execution of other computer readable program code, also executes computer readable program code associated with the haptic feedback keyboard control system as described in FIG. 1. During operation of each key on the keyboard 301, the metal traces 345 on the bottom surface of the contact foil layer 310 may receive an electrical charge from the respective piezoelectric elements 320 as they are compressed upon actuation at the metal traces 345 that conduct the electrical charge to the controller 325 associated with the keyboard 300.

The method may continue at block 408 with passing an electrical response signal to the piezoelectric element associated with the first key of the keyboard to create haptic feedback event to be felt at the first key of the keyboard. As described herein, the haptic feedback results from the electrical haptic response control signal, at a determined voltage, current, or polarity being applied to the piezoelectric material layer. The response signal may be a sine wave, a square wave, pulsed signal, or otherwise varied and modulated to create a haptic event of a key press for the user. Application of the electrical haptic response control signal to the piezoelectric material layer causes the piezoelectric material layer to stretch, compress, or return to its non-deformed state in some embodiments. The new stretched or compressed state of the piezoelectric material layer may create a haptic bump or other haptic feedback movement to be felt by the user at the key actuated on the keyboard when the piezoelectric element metal plate layer is warped by the piezoelectric material compressing or stretching in response to the haptic feedback signal. In one example embodiment, changing polarity and voltage levels in any portion of a haptic feedback signal may cause an expansion of the piezoelectric material causing it to stretch and a warping the metal plate layer into the underlying cavity. This may be followed by a haptic feedback signal of polarity and voltage level to compress of the piezoelectric material and warp the metal plate away from the cavity. In this way, a haptic event may mimic a mechanical keystroke at the actuated key on as feedback to a user's finger. Any combination of the above changes to the piezoelectric material may be generated by the haptic feedback signal for causing the metal plate to warp and generate the intended haptic feedback event.

At block 410, a second electrical lighting control signal or supply of voltage may be conducted from a light emitting diode controller to one or more LEDs via a top surface of the contact foil. For example, in an embodiment described with reference to FIG. 3, an LED controller 325 in an embodiment may transmit a second electrical signal to one or more of the plurality of LEDs 350 via metal traces 346 in the top surface of the contact foil 310. Such a second electrical lighting control signal may direct operation of the one or more LEDs 350 in an embodiment to illuminate and backlight the key or keys of the haptic keyboard of various embodiments herein.

Light may be emitted via a light emitting diode in response to the second electrical signal at block 412 in an embodiment. For example, in an embodiment described with reference to FIG. 2A, FIG. 2B, or FIG. 2C the LED 250 or 251, or micro LED 252 may emit light of varying intensities and colors, dependent upon the second electrical signal received at the LED 250 or 251, or micro LED 252 from the operably connected LED controller. In some embodiments, the LED 250 or 251, or micro LED 252 may emit light in only one color, or one intensity, and the LED controller may operate to place the LED 250 or 251, or micro LED 252 in an off or on state only.

At block 414, light emitted from the LED may be guided through a light guide layer toward a translucent portion of the coversheet incorporating the keyboard in an embodiment. For example, in an embodiment described with reference to FIG. 2A, the LED 250 may be embedded within a light guide layer 255 that operates to redirect light emitting omnidirectionally from the LED 250 toward translucent portions of the coversheet 205. The light guide layer 255 in such an embodiment may be formed using an injection molding process that includes forming a single translucent ABS layer, then machining away portions of the translucent ABS light guide layer 255 to accommodate insertion of the LED 250 within the ABS light guide layer 255, and to form vias through which light emitted from the LED 250 may be guided toward the one or more translucent portions of the coversheet 205 or key pedestal 206 through which light will be emitted.

As another example, in an embodiment described with reference to FIG. 2B, a bottom surface of the coversheet 205 may be machined away to form a light guide layer 256. For example, the bottom surface of the coversheet 205 (e.g., surface nearest LEDs 251) may be machined away to accommodate insertion of the LED 251 within the coversheet 205 and to form vias through which light emitted from the LED 251 may be guided toward the one or more translucent portions of the coversheet 205 or key 200 through which light will be emitted. Coversheet 205 may be wholly or partially made of a translucent bicarbonate material covered in paint such that it may be etched to be translucent to serve as a light guide portion for key 200. By machining a light guide pattern directly into the bottom surface of the coversheet 205, embodiments of the present disclosure may incorporate fewer layers of the keyboard stackup, resulting in a thinner, more light weight keyboard.

In still another embodiment, described with reference to FIG. 2C, the micro LED 252 may be situated directly beneath the translucent portion of the key pedestal 206, and a light guide layer may not be needed. By removing the need for such an added light guide layer in an embodiment, the overall thickness of the haptic keyboard assembly may be decreased. In such an embodiment, block 414 may be skipped, and the method may end.

Figure 5:
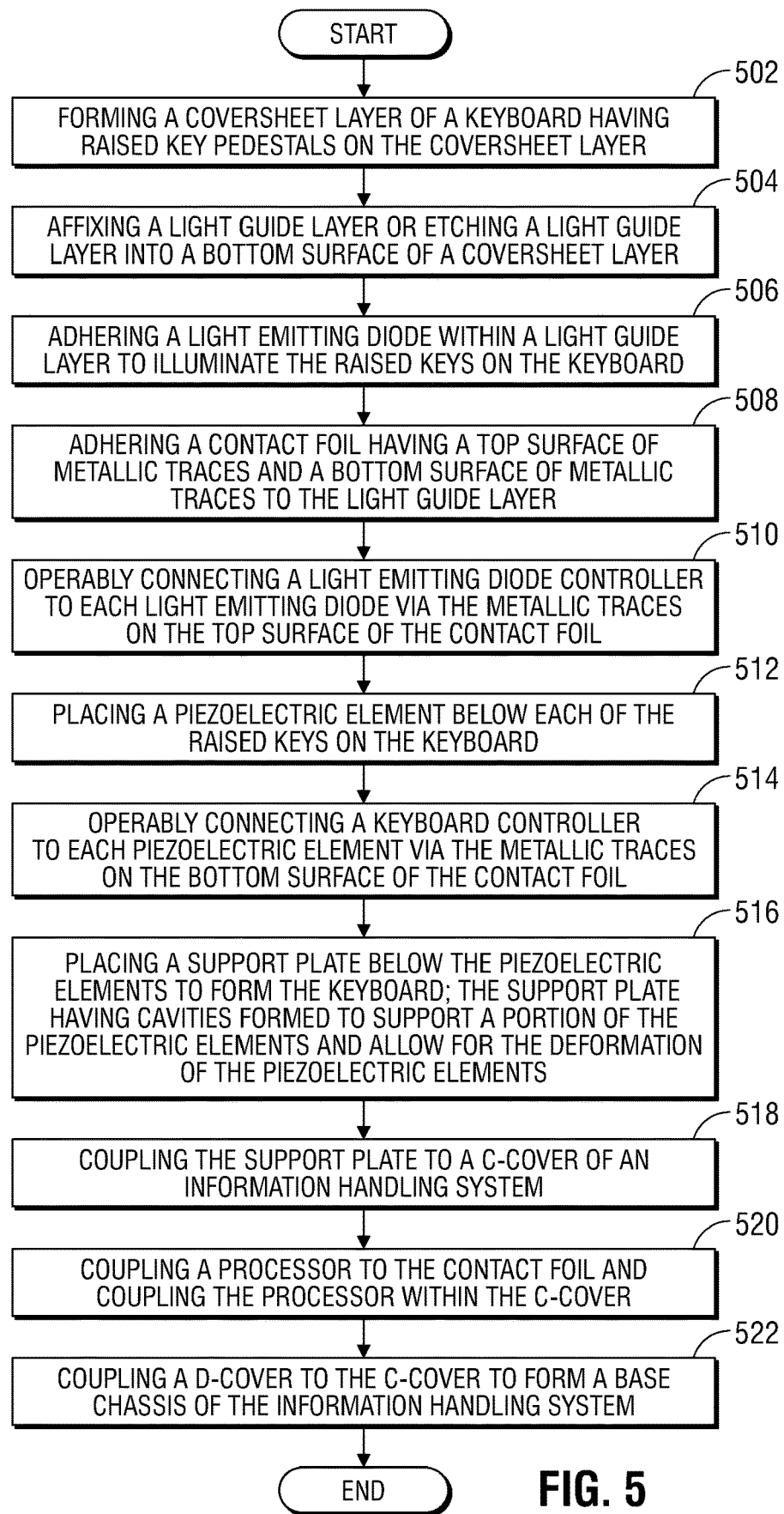
FIG. 5 is a flow diagram illustrating a method of manufacturing a light emitting diode backlit keyboard of an information handling system according to an embodiment of the present disclosure.

FIG. 5 is a flow diagram illustrating a method of manufacturing a light emitting diode backlit piezo electric haptic keyboard of an information handling system according to an embodiment of the present disclosure. As described herein, in order to decrease the thickness and weight of the keyboard and laptop base, one or more layers of the keyboard in embodiments of the present disclosure may provide a dual purpose as part of a piezoelectric haptic feedback system, and as part of a backlighting system emitting light through translucent portions of the keyboard coversheet. For example, instead of incorporating multiple contact foil layers and an additional light guide layer to a piezoelectric keyboard, embodiments of the present disclosure use one or more of the existing layers of the piezoelectric keyboard described herein to provide such functionality.

The method in an embodiment may include forming a coversheet layer by forming a plurality of keys on a keyboard at block 502. For example, in an embodiment described with reference to FIG. 2A, FIG. 2B, or FIG. 2C, a coversheet 205 may be formed of any type of elastically resilient material that allows a portion of the key 200 to be deformed upon application of a pressure from a user's finger and allows the coversheet 205 to return to its pre-deformed state upon withdrawal of the pressure from the user's finger. The shape of the coversheet 205 in an embodiment may include a plurality of key pedestals 206 of various sizes and shaped so as to conform to a user's finger. In an embodiment, in order to shape the coversheet 205, the material used to form the coversheet 205 may be subjected to an injection molding process. As such, a top portion of the coversheet 205 may be formed to be ergonomically beneficial to a user's actuation such as by conforming to the user's fingers and including a pedestal 206 to highlight the key location, for example. In other embodiments, no key pedestals may be formed and a key location may be described in coversheet 205 via markings, depressions, key framing, or other methods. Any number of processes may be included with the injection molding process. In an embodiment, the injection molding process used to form the coversheet 205 may include forming a number of holes within a sheet of acrylonitrile butadiene styrene (ABS), correlating with a number of keys on a keyboard. The formation of the coversheet 205 may continue with injection molding a translucent ABS through the holes to form a raised portion correlating with each of the number of keys on the keyboard.

In other embodiments, the C-cover may include a plurality of vias for keys 200 having a cover sheet 205 or cap for each key. A key pedestal 206 for each key 200 in a solid-state keyboard of the present embodiments may be disposed through the vias in the C-cover in such embodiments. Each haptic key of the haptic keyboard in such an embodiment may include a cover layer that protrudes through the key vias in the coversheet 205. Layering under the coversheet may include material layers that are hydrophobic or have other properties. Though gaps between haptic keys and key vias may be minimized, such gaps may be useful for cooling ventilation of the base chassis or for allowing backlighting to frame the haptic keys. Further, it is contemplated that in some embodiments one or the other of a haptic keyboard or haptic touchpad may be used with a keyboard having mechanically actuated keys or a touchpad with a mechanically actuate diving board mechanism.

At block 504, a light guide layer may affix to or may be etched into a bottom surface of the cover sheet layer as shown in the embodiments of FIG. 2A or FIG. 2B respectively. In one embodiment such as depicted in FIG. 2A, a separate light guide layer 255 may be disposed between the coversheet and the contact foil. For example, in an embodiment described with reference to FIG. 2A, the light guide layer 255 may be formed using an injection molding process that includes forming a single translucent ABS layer, and machining away portions of the ABS layer to accommodate insertion of the LED 250 within the ABS light guide layer 255. Portions of the translucent ABS light guide layer 255 may then be machined away to form vias through which light emitted from the LED 250 may be guided toward the one or more translucent portions of the coversheet 205 or key pedestal 206 through which light will be emitted.

In another example, such as the embodiment described with reference to FIG. 2B, a bottom surface of the coversheet 205 (e.g., surface nearest LEDs 251) may be machined away to accommodate insertion of the LED 251 within the coversheet 205 and to form vias of a lightguide portion 256 of the coversheet 205 through which light emitted from the LED 251 may be guided toward the one or more translucent portions of the coversheet 205 or key 200 and through which light will be emitted. By machining a light guide pattern portion 256 directly into the bottom surface of the coversheet 205 which may be made of polycarbonate material in some examples, embodiments of the present disclosure may incorporate fewer layers of the keyboard stackup, resulting in a thinner, more light weight keyboard.

In still another embodiment, described with reference to FIG. 2C, the micro LED 252 may be situated directly beneath the translucent portion of the key pedestal 206, and a light guide layer may not be needed. By removing the need for such an added light guide layer in an embodiment, the overall thickness of the haptic keyboard assembly may be decreased. In such an embodiment, block 504 may be skipped, and the method may proceed directly from block 502 to block 506.

An LED may be adhered within a light guide layer beneath each of the raised keys on the keyboard in an embodiment at block 506. Light may be transferred to each raised key via the light guide layer. In some embodiments, an LED may be designated for each key or, in other embodiments, the light guide layer may provide backlighting illumination for several keys in the coversheet layer. For example, in an embodiment described with reference to FIG. 2A that incorporates a light guide layer separate from the coversheet, the LED 250 may be embedded within the light guide layer 255 that operates to redirect light emitting omnidirectionally from the LED 250 toward translucent portions of the coversheet 205. As another example, in an embodiment described with reference to FIG. 2B in which a bottom surface of the coversheet 205 operates as the light guide layer (thus obviating the need for an additional light guide layer), LEDs 251 may be embedded within portions of the coversheet 205 that have been machined away to accommodate such insertion and in which a light guide layer portion 256 has been formed. In still another embodiment, described with reference to FIG. 2C, the micro LED 252 may be situated directly beneath the translucent portion of the key pedestal 206, and a light guide layer may not be needed.

At block 508, a contact foil layer having separate metallic traces on its top and bottom surfaces may be adhered to a light guide layer in an embodiment. For example, in an embodiment described with reference to FIG. 3, the contact foil layer 310 may be adhered to the lightguide layer, which is adhered to or etched into the coversheet 305, via the first adhesive 315. The contact foil layer 310 in such an embodiment may include a number of metal traces 346 formed on a top surface (e.g., surface nearest the LEDs 350) of the contact foil layer 310, and a number of metal traces 345 formed on the bottom surface (e.g., surface nearest support plate 330) of the contact foil layer 310. In an example embodiment described with reference to FIG. 2A that incorporates a light guide layer 255 separate from the coversheet 205, the contact foil layer 210 may be situated beneath the light guide layer 255 and electrically coupled to LEDs in a lightguide layer 255. In an example embodiment described with reference to FIG. 2C, an array of micro LEDs 252 may be adhered directly to the surface of the contact foil layer 210.

A light emitting diode controller may be operably connected to each LED via the metallic traces on the top surface of the contact foil in an embodiment at block 510. For example, in an embodiment described with reference to FIG. 3, the metal traces 346 formed on a top surface (e.g., surface nearest the LEDs 350) of the contact foil layer 310 may electrically and communicatively couple each of the plurality of light emitting diodes 350 to a light emitting diode (LED) controller 325 of an information handling system. In an embodiment, the LED controller 325 may be a dedicated LED controller 325 communicatively coupled to the contact foil layer 310 so as to transmit electrical signals controlling functionality of each of the plurality of LEDs 350, either as a group, or separately for backlight illumination of the keyboard according to embodiments herein. In an example embodiment described with reference to FIG. 2C, in which an array of micro LEDs 252 is adhered directly to the surface of the contact foil layer 210, each of the metal traces on the top surface of the contact foil layer 210 may electrically couple one of the array of micro LEDs 252 to the LED controller.

At block 512, a piezoelectric element may be placed below each of the keys on the keyboard. For example, in an embodiment described with reference to FIG. 2A, FIG. 2B, or FIG. 2C, the piezoelectric element 220 may be housed over a cavity 231 formed in the support plate 230. The piezoelectric element 220 may comprise a first portion 222 and a second portion 225. The first portion 222 may be a ceramic disc in an embodiment, and the second portion 225 of the piezoelectric element 220 may be a metal plate or ring, such as a brass plate, that extends beyond the edges of cavity 231. The brass plate 225 in an embodiment may support deflection of the piezoelectric element 220 into the cavity 231 to detect mechanical actuation of the key 200. The number of keys formed in the keyboard in an embodiment may vary based on the number and arrangement of keys to be used as input to the information handling system. For example, the number of piezoelectric elements may be equal to a number of numerical keys to be formed on a ten-key type input device. Additionally, the number of piezoelectric elements may be equal to a number of alphanumeric keys to be formed on a QWERTY-type keyboard. Alternative and customized keyboards are contemplated under the concepts described herein and the present description contemplates these alternative keyboard layouts.

A keyboard controller may be operably connected in an embodiment to each piezo electric element via the metallic traces on the bottom surface of the contact foil at block 514. For example, in an embodiment described with reference embodiments of FIG. 2A, FIG. 2B, or FIG. 2C, the piezoelectric element 220 may be electrically and communicatively coupled to the metal traces formed on the bottom of the contact foil 210 via metallic connection points 235 and 240, such as a solder dot. In a specific embodiment, the piezoelectric element 220 may be electrically and communicatively coupled at a first portion 222 to a metallic trace formed on the contact foil 210 by a first soldering point 235 and at a second portion 225 to a metallic trace in contact foil 210 via a second soldering point 240. The soldering points 235 and 240 may be silver contact points for making electrical contact to first portion 222 and second portion 225 of the piezoelectric element 220. As so oriented, the first soldering point 235 and second soldering point 240 may be formed to receive an electrical charge upon deflection of the piezoelectric element 220 as a user actuates the key 200. As described herein, the electrical charge may be detected by the controller as received from the electrically-conductive metal traces and portions 222 and 225 of the piezoelectric element 220.

As another example, in an embodiment described with reference to FIG. 3, a number of metal traces 345 formed on the bottom surface (e.g., surface nearest support plate 330) of the contact foil layer 310 may electrically and communicatively couple each of the keys and a corresponding piezoelectric element 320 to a keyboard controller 326 of an information handling system that includes a haptic feedback keyboard control system such as described in connection with FIG. 1. In other words, a top surface of the contact foil 310 in an example embodiment may include traces 346 operatively coupling a plurality of LEDs 350 to an LED controller 325, while the bottom surface of the contact foil 310 may include traces 345 operatively coupling the plurality of piezoelectric elements 320 to a keyboard controller 326. In an embodiment, the keyboard controller 326 may be a dedicated controller communicatively coupled to the contact foil layer 310 so as to detect electrical charges from each of the piezoelectric elements 320 and provide electrical haptic response control signals back to the respective piezoelectric elements 320. Such a dual-use of the single contact foil 310 (e.g., to electrically couple the LEDs 350 to the LED controller 325 and to electrically couple the piezoelectric elements 320 to the keyboard controller 326) may obviate the need for two separate contact foil layers, thus decreasing the thickness and weight of the keyboard stackup 300.

The method in an embodiment may also include, at block 516, placing a support below the piezoelectric elements; the support having cavities formed to support a portion of the piezoelectric elements and allows for the deformation of the piezoelectric elements into the underlying cavities. As described herein, the support may both hold the layers of the keyboard together, including the outer edges of the piezoelectric elements, as well as maintain the keyboard to a more rigid portion of the information handling system. For example, in an embodiment described with reference to FIG. 2A, FIG. 2B, or FIG. 2C, the brass plate 225 of piezo electric element 220 may support deflection of the piezoelectric element 220 into the cavity 231 to detect mechanical actuation of the key 200. In an embodiment, the support plate 230 may have a cavity 230 formed therein such that the piezoelectric element 220 may be allowed to be deflected therein when the key 200 is actuated by a user and cavity 231 may be an aperture or hole through support plate 230 or may be a depression or hole in support plate 230 that does not pass through 230. The cavity 231 may be formed into or through a top surface of the support plate 230, and the second layer of adhesive 215.

The support plate may be made of rigid material such as a metal to provide support for one or more layers of the keyboard. For example, in an embodiment described with reference to FIG. 3, the support plate 330 may prevent deformation of the keyboard stack up 300 except for, in some embodiments, the contact foil layer 310, piezoelectric element 320, first adhesive layer 315, and second adhesive layer 316 during operation of the haptic keys. As such, the contact foil layer 310 may be allowed to detect the deformation of the piezoelectric elements 320, while a user of the keyboard 301 may feel a level of rigidity in the keyboard 301 except that at the locations of the keys where the user has expected that some level of deformation occurs when pressure is applied to provide for key actuation of the piezoelectric element 320.

The method also includes, at block 518, coupling the support plate to the C-cover via a number of screws, bolts or other type of coupling device described herein. For example, in an embodiment described with reference to FIG. 3, the keyboard stack up 300 may further include a C-cover substructure 335 forming part of the base chassis with a cutout for keyboard 301 and touchpad 302. The C-cover substructure 335 may be made of a rigid material that prevents little or no movement, such as a metal, for example. In an embodiment, the support plate 330 may be secured to the C-cover substrate 335 via a number of bolts, screws, or other mechanical or chemical coupling device. In some embodiments, the support plate 330 may be operatively coupled to the D-cover of the information handling system.

At block 520, a processor may be coupled to the contact foil and coupling the processor within the C-cover. For example, the contact foil may be coupled to a processor or a keyboard controller of the information handling system. In an embodiment described with reference to FIG. 3, for example, the contact foil layer 310 may include a number of metal traces 346 formed on the top surface of the contact foil layer 310 opposite the metal traces 345 that electrically and communicatively couples each of the keys and a corresponding piezoelectric element 320 to a keyboard controller 326 of an information handling system that includes a haptic feedback keyboard control system such as described in connection with FIG. 1. In other words, a top surface of the contact foil 310 in an example embodiment may include traces 346 operatively coupling a plurality of LEDs (not shown) to an LED controller 325, while the bottom surface of the contact foil 310 may include traces 345 operatively coupling the plurality of piezoelectric elements 320 to a keyboard controller 326. In an embodiment, the keyboard controller (not shown) may be a dedicated controller communicatively coupled to the contact foil layer 310 so as to detect electrical charges from each of the piezoelectric elements 320 and provide electrical haptic response control signals back to the respective piezoelectric elements 320. In an alternative embodiment, the keyboard controller (not shown) may be a processor of the information handling system that, among other computations and execution of other computer readable program code, also executes computer readable program code associated with the haptic feedback keyboard control system as described in FIG. 1.

The method also includes, at block 522, the coupling of a D-cover to the C-cover to form a base chassis of the information handling system. In an embodiment, the C-cover may also include a track pad described herein or a standard mechanical touchpad. Components of the information handling system including processors such as a CPU or GPU, memory, battery and power systems, wireless adapters, motherboard and graphics boards, controllers and the like may be installed in the D-cover accordingly to methods understood in the art. With a haptic keyboard and haptic touchpad, a simple uniform coversheet may be used. The D-cover may be coupled to the C-cover so as to completely enclose all layers of the keyboard, except for the coversheet layer in some embodiments. In other embodiments, each key coversheet may be installed through vias in the C-cover to form the haptic keys of the keyboard or a haptic touchpad may be accessible through a touchpad via in the C-cover. The D-cover may then form the bottom surface of the base portion of an information handling system, such as, for example, a laptop or tablet type personal computing device. Additionally, a display chassis may be operatively coupled via a hinge and power and data coupling to the base portion of the information handling system according to various techniques understood in the art. At this point the method may end.

By etching the light guide layer into the bottom surface of the coversheet, or by using metal traces on both the bottom and top surface of the contact foil, as described herein, the overall thickness of the information handling system may be reduced so as to decrease the size and weight of the information handling system. In other embodiments, because the keyboard described herein has a reduced thickness, the space within the information handling system used to house other components, such as a battery, of the information handling system may be increased allowing for the increase in size of these components or the inclusion of additional components within the chassis of the information handling system. Additionally, because the solid-state keyboard described herein does not include the mechanical components (i.e., scissor mechanism and coupled key cap or dive board mechanism) as other keyboards or touchpads, the keyboard may be less susceptible to wear or mechanical strain over time. Instead, with the implementation of the piezoelectric elements and dual-purpose of one or more layers, the solid-state keyboard and backlight systems of embodiments herein use fewer mechanical parts and may be more robust, resulting in longer usable life.

The blocks of the flow diagrams of FIGS. 4 and 5 or steps and aspects of the operation of the embodiments herein and discussed herein need not be performed in any given or specified order. It is contemplated that additional blocks, steps, or functions may be added, some blocks, steps or functions may not be performed, blocks, steps, or functions may occur contemporaneously, and blocks, steps or functions from one flow diagram may be performed within another flow diagram.

Devices, modules, resources, or programs that are in communication with one another need not be in continuous communication with each other, unless expressly specified otherwise. In addition, devices, modules, resources, or programs that are in communication with one another may communicate directly or indirectly through one or more intermediaries.

Although only a few exemplary embodiments have been described in detail herein, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

The subject matter described herein is to be considered illustrative, and not restrictive, and the appended claims are intended to cover any and all such modifications, enhancements, and other embodiments that fall within the scope of the present invention. Thus, to the maximum extent allowed by law, the scope of the present invention is to be determined by the broadest permissible interpretation of the following claims and their equivalents and shall not be restricted or limited by the foregoing detailed description.

What is claimed is:

1. A backlit haptic keyboard of an information handling system, comprising:
    a coversheet to identify a key location of the haptic keyboard;
    a support layer;
    a contact foil placed between the coversheet and the support layer;
    a light emitting diode (LED) controller of the information handling system operatively coupled to a first surface of the contact foil via top metallic traces printed upon a top surface of the contact foil to supply a voltage to a plurality of LEDs placed between the coversheet and the contact foil, where the LED controller is operatively coupled to each of the plurality of LEDs instructing a first of the plurality of LEDs to operate in an ON state and instructing a second of the plurality of LEDs to operate in an OFF state;
    the light emitting diode emitting light through a translucent portion of the coversheet;
    a piezoelectric element placed between the contact foil and support layer to receive an applied mechanical stress at the key location of the coversheet and generate an electric actuation signal;
    a keyboard controller of the information handling system operatively coupled to a second surface of the contact foil to:

receive an electric actuation signal from the piezoelectric element placed under the mechanical stress via bottom metallic traces printed upon a bottom surface of the contact foil; and send an electrical haptic response control signal to the piezoelectric element to cause the piezoelectric element to generate haptic feedback at the key location.

2. The keyboard of claim 1, wherein the light emitting diodes are micro light emitting diodes emitting light and are situated directly beneath the key location.

3. The backlit haptic keyboard of claim 1 further comprising:
a light guide layer placed between the LEDs and the translucent portion of the coversheet.

4. The keyboard of claim 1, wherein a surface of the coversheet disposed nearest the LEDs comprises a light guide layer.

5. The keyboard of claim 1, wherein the contact foil is a flexible printed circuit board and the top metallic traces and bottom metallic traces are comprised of copper.

6. The backlit haptic keyboard of claim 1 further comprising:
each of the plurality of LEDs is situated beneath one of a plurality of keys of the haptic keyboard.

7. The backlit haptic keyboard of claim 6 further comprising:
the LED controller operatively coupled to each of the plurality of LEDs instructing a first portion of the plurality of LEDs to emit light at a first intensity and instructing a second portion of the plurality of LEDs to emit light at a second intensity.

8. A method of manufacturing an LED backlit haptic keyboard for an information handling system, comprising:
operatively coupling a light guide layer to a coversheet layer;
adhering a contact foil on a bottom surface of the light guide layer;
inserting a plurality of light emitting diodes (LEDs) within a cavity formed in the light guide layer;
operably connecting the plurality of LEDs to an LED controller via top metallic traces printed upon a top surface of a contact foil placed beneath the light guide layer, where coupling an LED controller to the plurality of LEDs, where the LED controller is configured to instruct a first of the plurality of LEDs to operate in an ON state and configured to instruct a second of the plurality of LEDs to operate in an OFF state;
placing a piezoelectric element below the contact foil for electrical coupling to a keyboard controller via bottom metallic traces printed upon a bottom surface of the contact foil;
placing a support plate below the piezoelectric element;
the support plate having a cavity formed to support a portion of the piezoelectric element while allowing for the deformation of the piezoelectric element into the cavity;
coupling the support plate to the C-cover of the information handling system; and
coupling the keyboard controller to the contact foil and enclosing the keyboard controller within the C-cover.

9. The method of claim 8 further comprising:
machining away portions of a bottom surface of the coversheet layer to form the light guide layer that is partially translucent.

10. The method of claim 9, wherein the coversheet layer comprises polycarbonate material.

11. The method of claim 8 further comprising:
inserting each of the plurality of LEDs into one of a plurality of cavities in the lightguide layer.

12. The method of claim 8 further comprising:
adhering a partially translucent coversheet layer to a top surface of the light guide layer.

13. The method of claim 8 further comprising:
inserting each of the plurality of LEDs into one of a plurality of cavities in the light guide layer; and
wherein each of the plurality of LEDs is situated beneath one of a plurality of keys of the LED backlit haptic keyboard.

14. The method of claim 8, wherein the contact foil is comprised of polyester and the top metallic traces and bottom metallic traces are comprised of silver.

15. A backlit haptic keyboard of an information handling system, comprising:
a coversheet to identify a key location of the haptic keyboard, wherein a bottom surface portion of the coversheet disposed nearest a light emitting diode (LED) comprises a light guide layer;
a support layer;
a contact foil placed between the coversheet and the support layer;
an LED controller of the information handling system operatively coupled to a first surface of the contact foil via top metallic traces printed upon a top surface of the contact foil to supply a voltage to a plurality of LEDs placed between the coversheet and the contact foil, where the LED controller is operatively coupled to each of the plurality of LEDs instructing a first of the plurality of LEDs to emit light at a first intensity and instructing a second of the plurality of LEDs to emit light at a second intensity;
the light emitting diode emitting light through a translucent portion of the coversheet;
a piezoelectric element placed between the contact foil and support layer to receive an applied mechanical stress at the key location of the coversheet and generate an electric actuation signal;
a keyboard controller of the information handling system operatively coupled to a second surface of the contact foil to:
receive an electric actuation signal from the piezoelectric element placed under the mechanical stress via bottom metallic traces printed upon a bottom surface of the contact foil; and
send an electrical haptic response control signal to the piezoelectric element to cause the piezoelectric element to generate haptic feedback at the key location.

16. The keyboard of claim 15, wherein the contact foil is comprised of polyester and the top metallic traces and bottom metallic traces are comprised of silver.

17. The keyboard of claim 15, wherein the contact foil is a flexible printed circuit board and the top metallic traces and bottom metallic traces are comprised of copper.

18. The backlit haptic keyboard of claim 15 further comprising:
each of the plurality of LEDs is situated beneath one of a plurality of keys of the haptic keyboard.

19. The backlit haptic keyboard of claim 18 further comprising:
the LED controller instructing a portion of the plurality of LEDs to operate in an OFF state.

20. The backlit haptic keyboard of claim 18 further comprising:
   the LED controller operatively coupled to each of the plurality of LEDs instructing a first of the plurality of LEDs to emit light of a first color; and
   the LED controller instructing a second of the plurality of LEDs to emit light of a second color.

\* \* \* \* \*